(12) United States Patent
Takashima

(10) Patent No.: US 11,742,019 B2
(45) Date of Patent: Aug. 29, 2023

(54) NONVOLATILE SEMICONDUCTOR MEMORY DEVICE

(71) Applicant: Kioxia Corporation, Tokyo (JP)

(72) Inventor: Daisaburo Takashima, Yokohama (JP)

(73) Assignee: Kioxia Corporation, Tokyo (JP)

( * ) Notice: Subject to any disclaimer, the term of this patent is extended or adjusted under 35 U.S.C. 154(b) by 60 days.

(21) Appl. No.: 17/471,981

(22) Filed: Sep. 10, 2021

(65) Prior Publication Data

US 2022/0284953 A1 Sep. 8, 2022

(30) Foreign Application Priority Data

Mar. 4, 2021 (JP) .................... 2021-034802

(51) Int. Cl.
*G11C 11/00* (2006.01)
*G11C 13/00* (2006.01)

(52) U.S. Cl.
CPC ........ *G11C 13/0009* (2013.01); *G11C 13/004* (2013.01); *G11C 13/0026* (2013.01); *G11C 13/0028* (2013.01); *G11C 13/0069* (2013.01)

(58) Field of Classification Search
CPC ............ G11C 13/0009; G11C 13/0026; G11C 13/0028; G11C 13/004; G11C 13/0069; G11C 13/0002; G11C 13/0004; G11C 13/0033; G11C 13/0061; G11C 2013/0092; G11C 2213/71; G11C 13/003; G11C 2213/75; H10B 63/845; H10B 63/34; H10N 70/826; H10N 70/8828; H10N 70/231
See application file for complete search history.

(56) References Cited

U.S. PATENT DOCUMENTS

| | | | |
|---|---|---|---|
| 589,447 A | 9/1897 | Strasser | |
| 2011/0273219 A1* | 11/2011 | Marotta | H03K 19/018528 327/333 |
| 2016/0099068 A1* | 4/2016 | Kwak | G11C 16/14 365/185.25 |
| 2017/0125100 A1* | 5/2017 | Lee | G11C 16/14 |
| 2021/0383880 A1* | 12/2021 | Chava | G11C 7/222 |
| 2021/0391016 A1* | 12/2021 | Chen | G11C 7/12 |

* cited by examiner

*Primary Examiner* — Hien N Nguyen
(74) *Attorney, Agent, or Firm* — Oblon, McClelland, Maier & Neustadt, L.L.P.

(57) ABSTRACT

According to one embodiment, there is provided a nonvolatile semiconductor memory device including a cell array. The cell array includes an array of a plurality of string blocks. Among the plurality of local string blocks, one local string block includes a block selection transistor and remaining local string blocks do not include a block selection transistor. A gate terminal of the block selection transistor of the one local string block is connected to a block selection line. Signals of two word lines connected to two adjacent string blocks in the bit line direction are common signals. Signals of two block selection lines connected to the two adjacent string blocks are independent of each other.

20 Claims, 20 Drawing Sheets

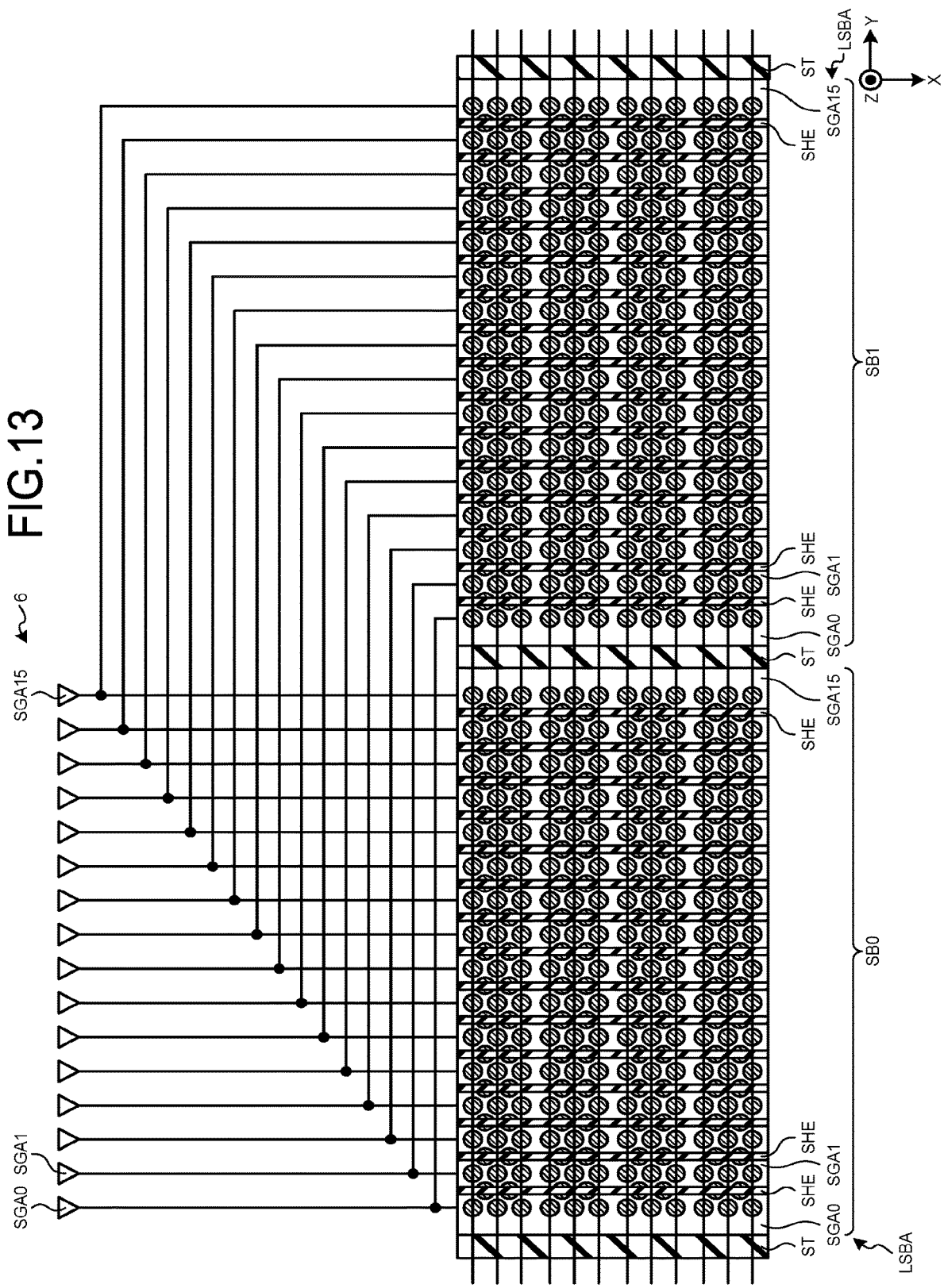

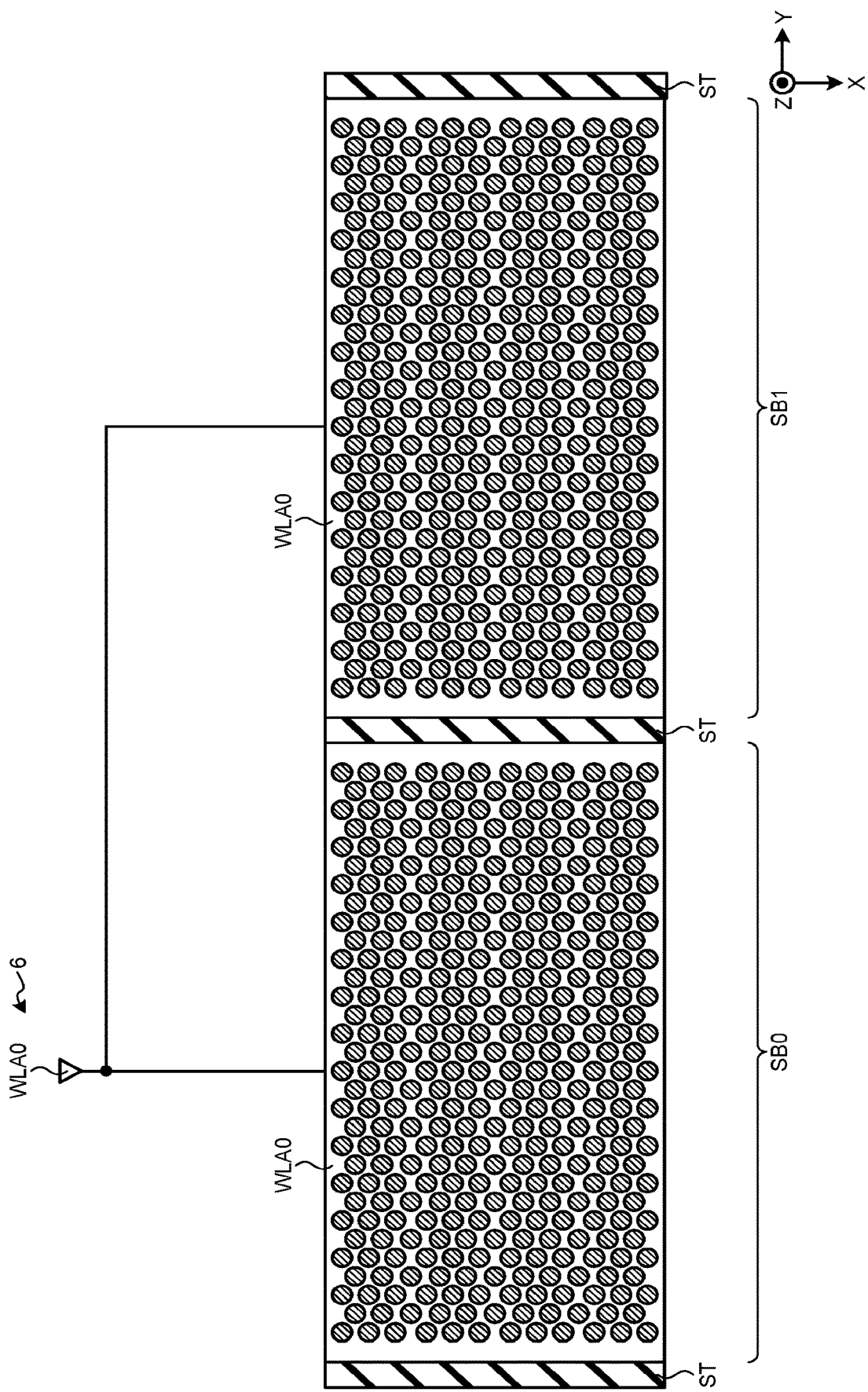

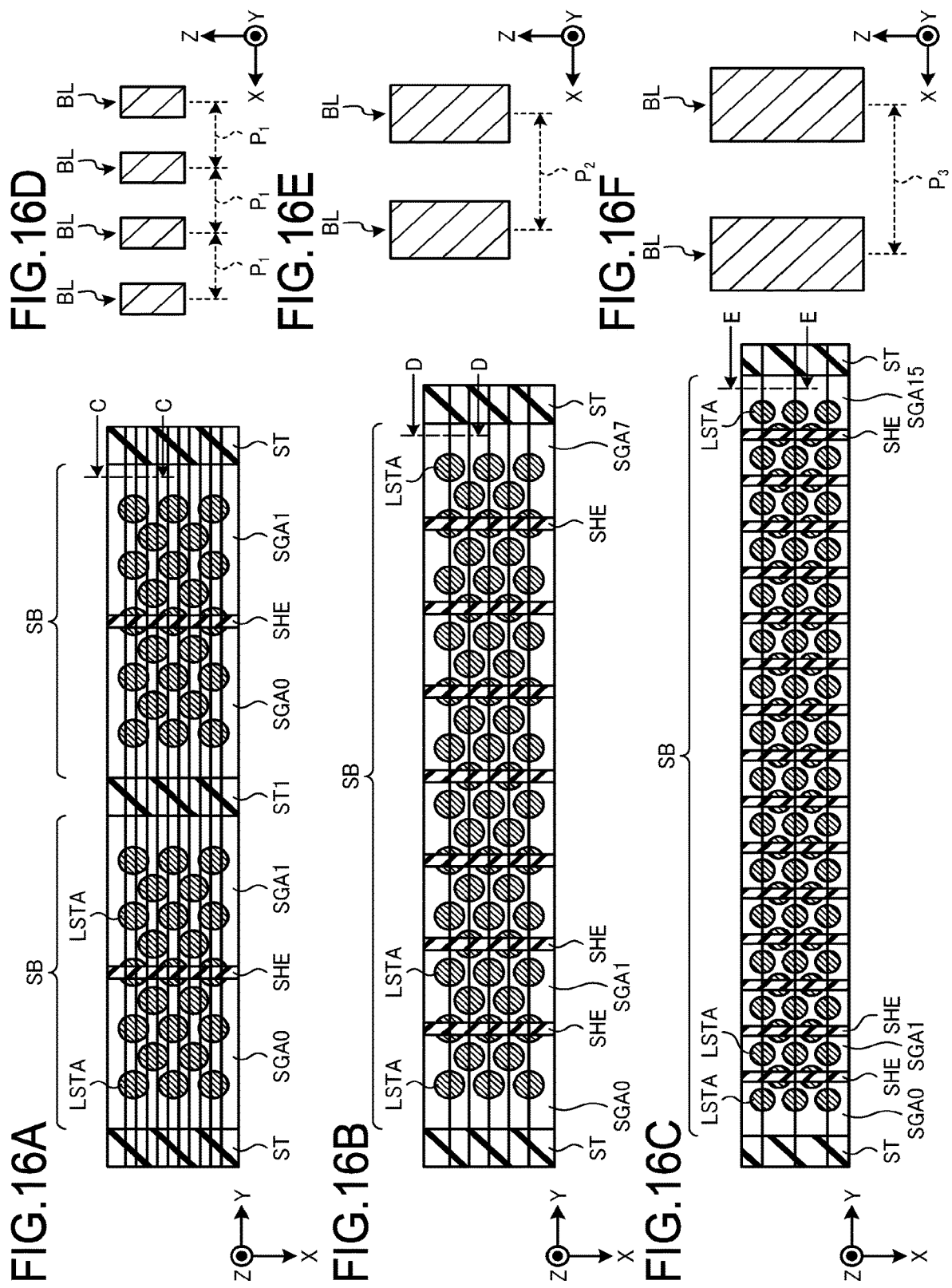

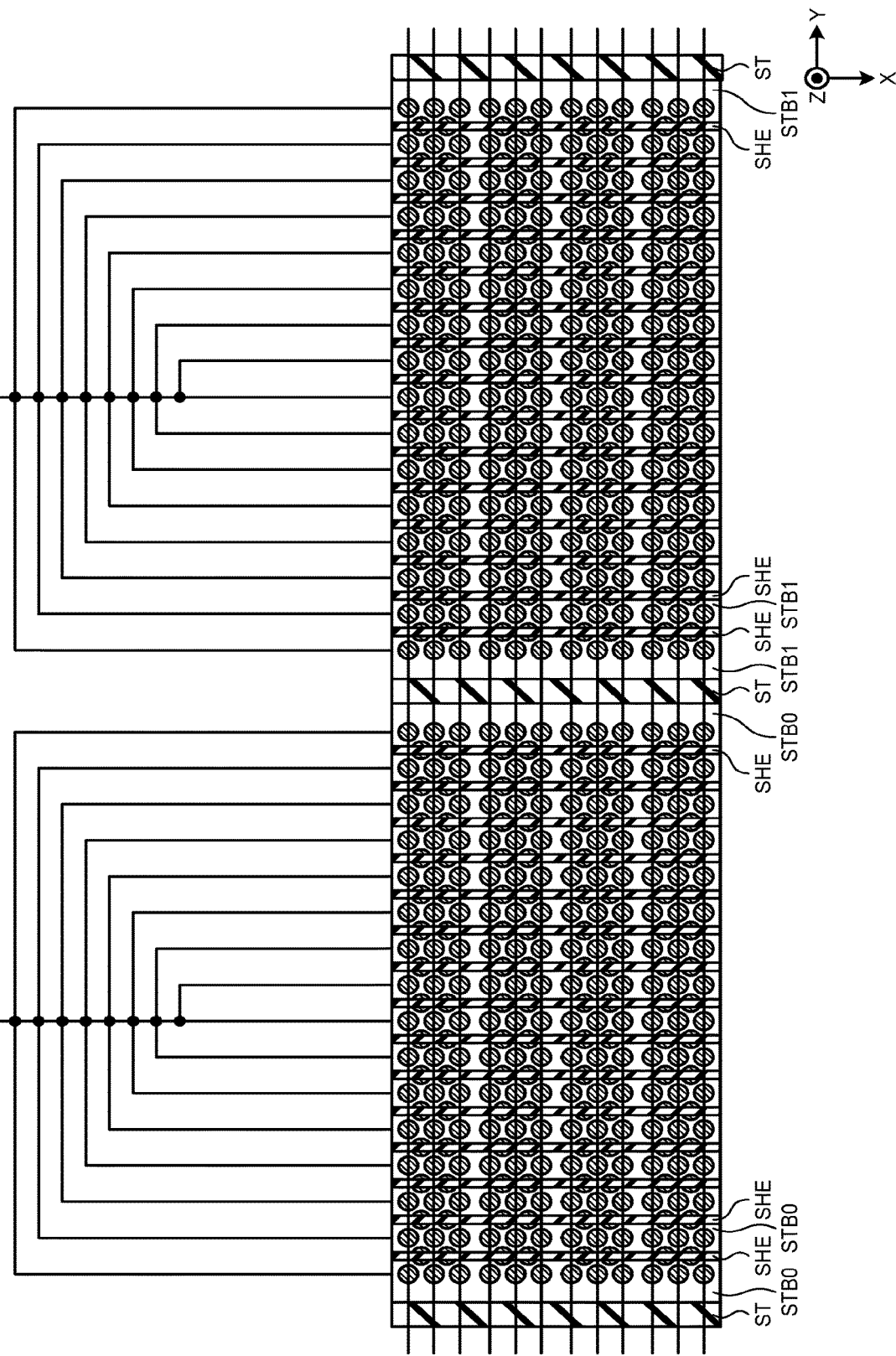

NONVOLATILE SEMICONDUCTOR MEMORY DEVICE

CROSS-REFERENCE TO RELATED APPLICATIONS

This application is based upon and claims the benefit of priority from Japanese Patent Application No. 2021-034802, filed on Mar. 4, 2021; the entire contents of which are incorporated herein by reference.

FIELD

Embodiments described herein relate generally to nonvolatile semiconductor memory devices.

BACKGROUND

In a nonvolatile semiconductor memory device including a plurality of memory cells in which a source and a drain of a transistor are connected to both ends of a resistance change element, information is stored in the memory cell by turning off a transistor of a selected memory cell to flow a current to the resistance change element and changing the resistance change element to a high resistance state (reset state) or a low resistance state (set state). In such a case, highly integrating the nonvolatile semiconductor memory device is desired.

BRIEF DESCRIPTION OF THE DRAWINGS

FIG. 13 is a diagram illustrating a connection configuration of a local string selection line and a driver in a third embodiment;

FIG. 14 is a diagram illustrating a connection configuration of a word line and the driver in the third embodiment;

FIGS. 16A to 16F are plan views and cross sectional views illustrating a configuration of a string block in a fourth embodiment;

FIG. 20 is a diagram illustrating a connection configuration of a block selection line and a block selection line driver according to a modification of the seventh embodiment.

DETAILED DESCRIPTION

Figure 1:
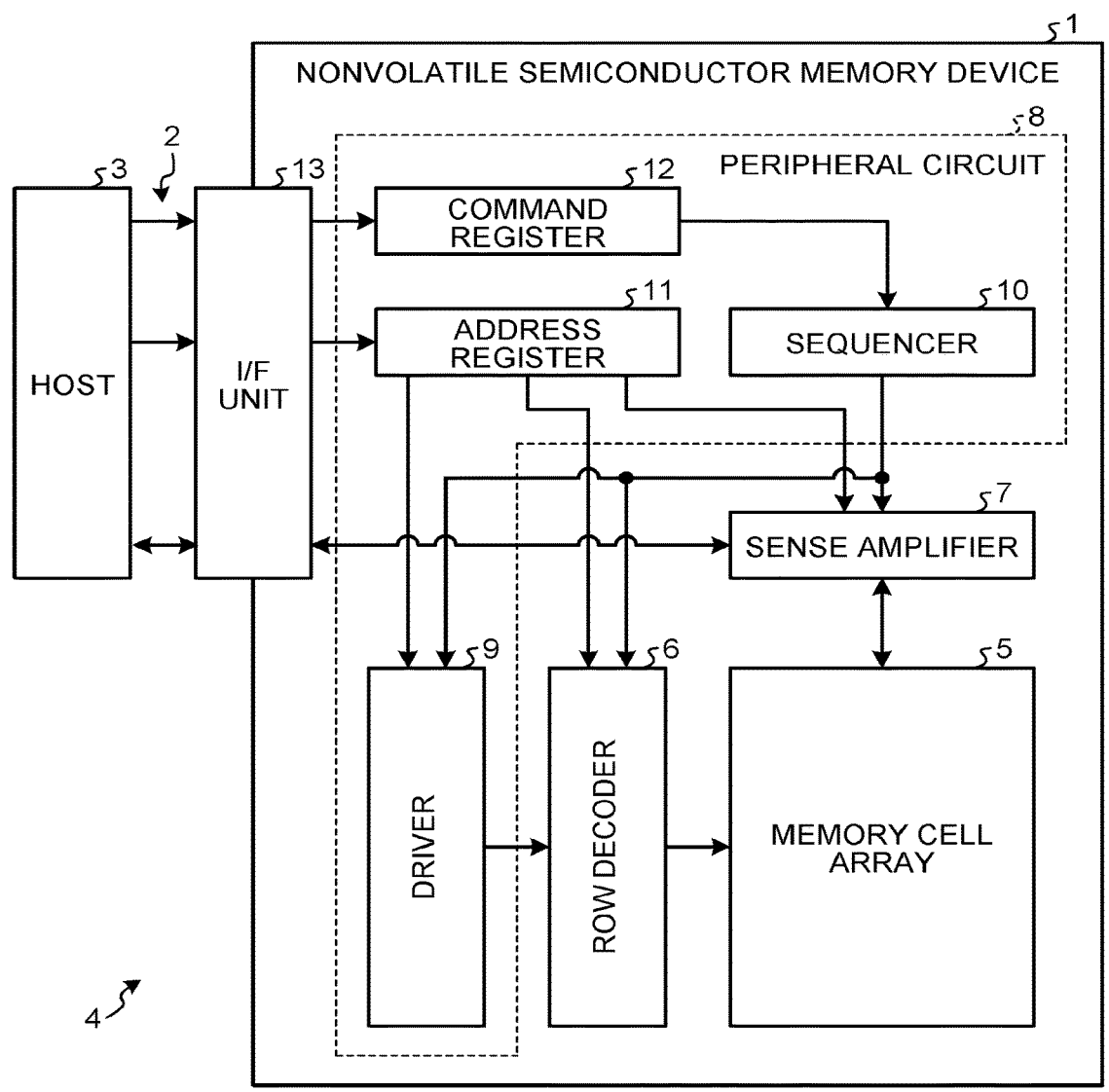
FIG. 1 is a diagram illustrating a schematic configuration of a nonvolatile semiconductor memory device according to a first embodiment.

In general, according to one embodiment, there is provided a nonvolatile semiconductor memory device including a cell array. The cell array includes an array of a plurality of string blocks. Each of the plurality of string blocks is connected to a bit line at one end. The plurality of string blocks is arranged with each other in the bit line direction. The string block has a plurality of local string blocks. The plurality of local string blocks is connected in series between the bit line and a source line. Each of the plurality of local string blocks is connected by a local bit line. The local string block has a plurality of local strings. The plurality of local strings is connected in parallel between the bit line and local bit line or between the local bit line and another local bit line. The local string has a plurality of memory cells and a string selection transistor. The plurality of memory cells each includes a cell transistor and a resistance change element. A gate terminal of the cell transistor is connected to a word line. The resistance change element is connected in parallel to both ends of the cell transistor. The plurality of memory cells are connected in series. A gate terminal of the string selection transistor is connected to a string selection line. The string selection transistors are further connected in series to the plurality of memory cells. Among the plurality of local string blocks, one local string block includes a block selection transistor and remaining local string blocks do not include a block selection transistor. A gate terminal of the block selection transistor of the one local string block is connected to a block selection line. Signals of two word lines connected to two adjacent string blocks in the bit line direction are common signals. Signals of two block selection lines connected to the two adjacent string blocks are independent of each other.

Exemplary embodiments of a nonvolatile semiconductor memory device will be explained below in detail with reference to the accompanying drawings. The present invention is not limited to the following embodiments.

First Embodiment

The nonvolatile semiconductor memory device according to the first embodiment includes a plurality of memory cells in which a source and a drain of a transistor are connected to both ends of a resistance change element. In a nonvolatile semiconductor memory device, information is stored in a memory cell by turning off a transistor of a selected memory cell to flow a current to a resistance change element and changing the resistance change element to a high resistance state (reset state) or a low resistance state (set state). The nonvolatile semiconductor memory device is a nonvolatile semiconductor memory in which memory cells are stacked in a three-dimensional direction using, for example, a phase change material or a resistance change material.

Today, semiconductor memories are used everywhere from main memories of large computers to personal computers (PCs), home electric appliances, and cellular phones, for example. The types of semiconductor memories available in the market include volatile dynamic RAM (DRAM), static RAM (SRAM), nonvolatile mask ROM (MROM), and flash EEPROM such as NAND type flash and NOR type flash. Despite being a volatile memory, DRAM is superior in its low cost (less than ¼ cell area compared to SRAM) and high speed (faster than flash EEPROM), and has a large market in the PC and mobile phone markets.

On the other hand, the nonvolatile flash EEPROM, which is rewritable and can be turned off, has recently become a very large market for cellular phones, various cards, and SSDs, for example. For example, in a three-dimensional flash memory, a control gate (word line) is stacked, and then holes are formed in a batch and memory cells are embedded, so that the cost can be reduced, and the three-dimensional flash memory becomes the mainstream of the present market. However, the number of times of rewriting (the number of times of writing/erasing) is about the fourth power to the third power of 10, the writing time is about microseconds and milliseconds, and a high voltage of 12 V to 22 V is required, which poses problems in terms of miniaturization and performance.

On the other hand, a ferroelectric memory (FeRAM), a magnetoresistive memory (MRAM), a phase change memory (PCM), and a resistance change memory (ReRAM), for example, have been actively developed as new memories in recent years. Of these memories, the MRAM, the PCM, and the ReRAM store information by variably storing the resistance of the information storage element of the memory cell. The magnetoresistive memory (MRAM) has a small resistance change rate of about 200%, and is difficult to scale due to demagnetizing fields. However, the phase change memory (PCM) and the resistance change memory (ReRAM) have the potential to become alternatives to NOR type flash and NAND type flash in that the resistance values of these memories change by two to five orders of magnitude and can be used for multi-level storage, and write and read currents can be reduced due to a reduction in the size of the storage element, which leads to higher integration. These resistance change memories, such as PRAM and RRAM (registered trademark), are three-dimensionally stacked and have a potential that can be made lower in cost than NAND type flash.

However, in the three-dimensional stacking method, the memory cells are arranged between the intersections of the orthogonal word lines WL and the bit lines BL, and at the time of writing, a current is supplied (voltage is applied) between the terminals, and the resistance of the storage element is increased (reset operation) and decreased (set operation) to store information. Since there is a half-selection in which half of the voltage is applied in addition to a full-selection of the selected cell, there are many cases where a self-rectifying function is provided in the storage element or a rectifier and a bidirectional rectifier are connected in series to the storage element. However, since the processing is repeated by stacking the word lines WL and the bit lines BL one by one, the cost tends to be high even if these lines are made three-dimensional.

In other words, the following problems (i) and (ii) exist with respect to the resistance change type nonvolatile semiconductor memory device.

(i) Since the three-dimensional flash memory can be manufactured by forming the oxide film and the sacrificial film alternately and successively and performing collective etching for forming memory holes, the manufacturing cost can be easily reduced. However, the three-dimensional flash memory is inferior to the resistance change type memory element in performance. For example, since the insulating film is tunneled and charges are stored in the charge storage film, it is difficult to increase the writing speed, and since the presence or absence of charges stored in the charge storage film through the insulating film is detected, it is difficult to increase the reading speed. Since the insulating film is tunneled and charges are stored in the charge storage film, the insulating film is liable to be degraded and the number of usable times is liable to be limited.

(ii) On the other hand, in a resistance change type memory element having high performance, for example, a phase change memory PCM, word lines and bit lines are alternately formed. Therefore, it is difficult to apply the continuous film formation, and the number of processing times is high relative to the number of film formation times, so that the manufacturing cost tends to increase.

In order to solve the above problems (i) and (ii), the following configurations (1) to (8) can be adopted in the nonvolatile semiconductor memory device.

(1) The nonvolatile semiconductor memory device has a cell array. The cell array includes an array of a plurality of string blocks. Each of the plurality of string blocks has one end connected to a bit line. The plurality of string blocks is arranged with each other in the bit line direction. In the string block, a plurality of local string blocks is connected in series between a bit line and a source line, and each of the plurality of local string blocks is connected by a local bit line. In the local string block, a plurality of local strings is connected in parallel between a bit line or a local bit line and another local bit line. In the local string, a plurality of memory cells including a cell transistor and a resistance change element is connected in series. In the cell transistor, a word line is connected to a gate terminal. The resistance change element is connected in parallel to both ends of the cell transistor. The local string is further connected in series with string selection transistors. In the string selection transistor, a gate terminal is connected to a string selection line. One local string block of the plurality of local string blocks includes a block selection transistor, and the remaining local string blocks do not include a block selection transistor. In the block selection transistor, a block selection line is connected to a gate terminal. Signals of the two word lines connected to two adjacent string blocks in the bit line direction are common signals. The signals of the two block selection lines connected to the two string blocks are independent of each other.

(2) In the nonvolatile semiconductor memory device of (1), signals of a plurality of the string selection lines connected to the identical local string block are independent of each other. Signals of two string selection lines connected to two adjacent local string blocks in the bit line direction are common signals.

(3) In the nonvolatile semiconductor memory device of (1), two string selection lines are connected to the identical wire at the cell array end and driven by the identical driving circuit.

(4) In the nonvolatile semiconductor memory device of (1), one local string block including a block selection transistor is a local string block on the bit line side of the plurality of local string blocks or a local string block on the source line side of the plurality of local string blocks.

(5) In the nonvolatile semiconductor memory device of (1), both ends of the string selection transistor are connected in parallel to the resistance change element.

(6) In the nonvolatile semiconductor memory device of (1), the resistance change element is composed of a first film having a cylindrical shape. The channel region of the cell transistor is composed of a second film having a cylindrical shape disposed outside the first film.

(7) In the nonvolatile semiconductor memory device of (1), the resistance change element is formed of a material mainly composed of at least one of Ge, Sb, and Te.

(8) In the nonvolatile semiconductor memory device of (1), when data is written to the selected memory cell, the unselected word line connected to the selected string block is set to a second potential higher than a first potential during standby. When data is read from the selected memory cell, the unselected word line connected to the selected string block is maintained at the second potential.

According to the nonvolatile semiconductor memory device in which the configurations (1) to (8) can be adopted, the following effects (A) to (C) can be realized.

(A) First, a memory cell is configured by a parallel connection of a cell transistor with a word line as a gate electrode and a two-terminal resistance change storage element such as a phase change memory, and a local string is formed by a series connection of a plurality of memory cells and a string selection transistor with a string selection line as a gate electrode. Therefore, as in the case of a conventional three-dimensional flash memory, a plurality of word line layers can be stacked, holes can be formed by collective etching, and a gate insulating film, a channel region, and a resistance change material can be embedded, thereby achieving a significant reduction in cost.

(B) Second, both ends of a plurality of local strings arranged in a bit line direction perpendicular to a word direction are connected to a local bit line to constitute a local string block, and a plurality of local string blocks is connected in series to constitute a string block. All cell transistors and all string selection transistors of an unselected local string block that does not include selected memory cells in the selected string block are thereby turned on during reading and writing operations, thereby allowing a current to flow from the local bit line to the local bit line at the other end via a plurality of unselected local strings. The parasitic resistance of the plurality of unselected local string blocks therefore can be significantly reduced, and consequently the current flowing to a two-terminal resistance change storage element of the selected memory cell can be significantly increased. Conversely, at the identical cell current, a substantial number of memory cell series of the string block can be greatly increased and the number of stacked word lines can be increased, so that a substantial cost reduction can be realized.

(C) Thirdly, all local strings in one local string block of a plurality of local string blocks connected in series are replaced with a local string with block selection configured by a series connection of a plurality of memory cells, a string selection transistor, and a block selection transistor using a block selection line as a gate electrode. For different string blocks adjacent in a plurality of bit line directions, each of the plurality of stacked word lines in each of the string blocks is thereby used as a common signal with the word lines of the same layer of the adjacent string blocks, and each of the plurality of string selection lines in each of the local strings in each of the string blocks is used as a common signal with each of the string selection lines of the same layer of the adjacent string blocks, but with the block selection lines of each of the string blocks used as an independent signal, only the string blocks including block selection transistors that are turned on by the selected block selection lines can be in conduction operation. Thus, the circuit area for driving the word lines and the string selection lines of the plurality of adjacent string blocks used as a common signal at the cell array end can be greatly reduced. For example, in order to realize PCM for high speed, the cell array size is required to reduce in order to reduce the word line delay, and the word line and string selection line driving circuit areas required for each array size can be prevented from being large. Further, setting the word line potential to a potential higher than 0 V during standby allows the unselected cell transistor to be turned on, even if the unselected word lines in the selected string block are not driven and remain at the high potential during cell data reading. Even if the word lines are used as a common signal to increase the load capacitance and the number of stacked word lines, driving the unselected word lines is not required, so that an increase in power consumption can be suppressed.

Specifically, a nonvolatile semiconductor memory device 1 according to the present embodiment can be configured as illustrated in FIG. 1. FIG. 1 is a diagram illustrating a schematic configuration of the nonvolatile semiconductor memory device 1. The nonvolatile semiconductor memory device 1 can be connected to a host 3 via a communication medium 2. The nonvolatile semiconductor memory device 1 is, for example, a resistance change type memory. The communication medium 2 is, for example, a serial communication line. The host 3 is, for example, a controller or a CPU. The configuration including the nonvolatile semiconductor memory device 1, the communication medium 2, and the host 3 can be configured as a memory system 4. The memory system may be a memory card such as an SD card, a storage system such as an SSD, or an eMMC device. The host 3 may be a controller or a CPU.

The nonvolatile semiconductor memory device 1 has a memory cell array 5, a row decoder 6, a sense amplifier 7, a peripheral circuit 8, and an interface unit (I/F unit) 13. The peripheral circuit 8 includes a driver 9, a sequencer 10, an address register 11, and a command register 12. The memory cell array 5 is arranged with a plurality of memory cells. The plurality of memory cells can be accessed using a plurality of word lines and a plurality of bit lines. Each of the plurality of word lines is associated with a row address. Each of the plurality of bit lines is associated with a column address. The command register 12 holds a command included in a host request received from the host 3 via the I/F unit 13. The address register 11 holds an address included in a host request received from the host 3 via the I/F unit 13.

The sequencer 10 executes the command held in the command register 12 to control the data write operation or read operation to the memory cell array 5. In response to control by the sequencer 10, the row decoder 6 can decode the address held in the address register 11 and select a word line corresponding to the decoded row address. In response to control by the sequencer 10, the driver 9 generates a voltage for selecting a word line and supplies the voltage to the row decoder 6. In response to control by the sequencer 10, the sense amplifier 6 can decode the address held in the address register 11 and select the bit line corresponding to the decoded column address.

Figure 2:
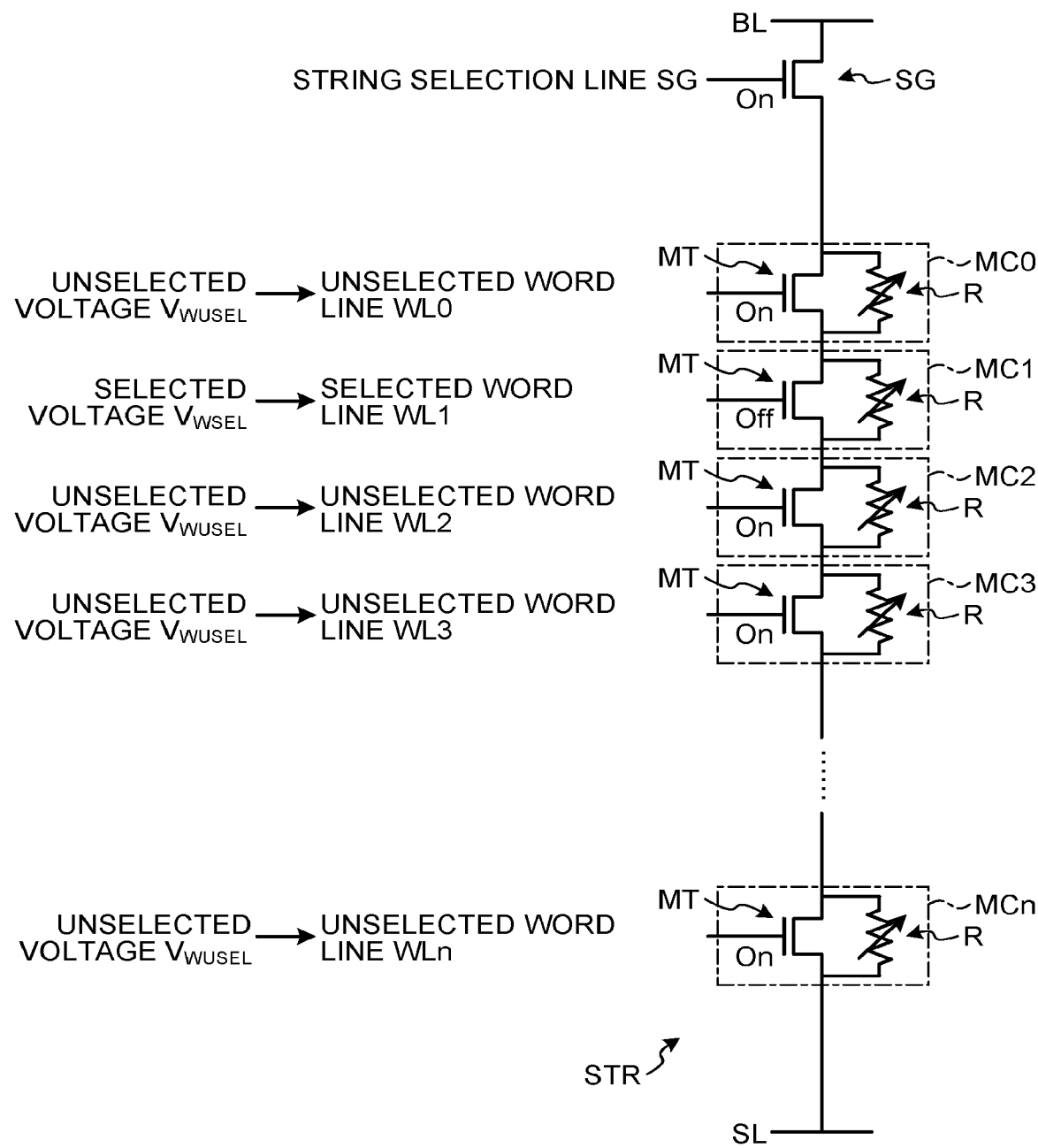
FIG. 2 is a circuit diagram illustrating a configuration of a string in the first embodiment.

When considering the three-dimensional arrangement of a plurality of memory cells in the memory cell array 5, a chain-connected memory is a configuration applicable to a resistance change type memory, such as a phase change memory (PCM). In the chain-connected memory, a plurality of memory cells MC0 to MCn (n is an arbitrary integer of 4 or more) is connected in series to constitute a string STR as illustrated in FIG. 2. FIG. 2 is a circuit diagram illustrating the configuration of the string STR.

The memory cell MC is constituted of a resistance change type element R and a cell transistor MT connected in parallel. The string STR is constituted by connecting a bit line BL to one end of the plurality of memory cells MC0 to MCn connected in series via a string selection transistor SG and connecting a source line SL to the other end. Word lines WL0 to WLn are connected to the gates of the cell transistors MT of the memory cells MC0 to MCn. The row decoder 6 supplies a selected voltage $V_{WSEL}$ to a selected word line WL and supplies an unselected voltage $V_{WUSEL}$ to an unselected word line WL, of the plurality of word lines WL. Thus, the cell transistor MT of a selected memory cell MC is turned off, and the cell transistor MT of an unselected memory cell MC is turned on. When a voltage is applied between the bit line BL and the source line SL by the sense amplifier 7, since the cell transistor MT of the unselected memory cell MC is on, the voltage is not applied to the resistance change element R of the unselected memory cell MC, and since the cell transistor MT of the selected memory cell MC is off, most of the applied voltage between the bit line BL and the source line SL can be applied to the resistance change element R of the selected memory cell MC. Thus, data can be written to the resistance change element R of the selected memory cell MC, and data can be read because the resistance of the resistance change element R of the selected memory cell MC can be detected. Since this structure includes a configuration in which a plurality of memory cells MC is connected in a chain, the structure can be realized in a structure similar to a three-dimensional flash.

For a three-dimensional flash type memory cell array, an insulating film between a cylindrical semiconductor portion and a plate-shaped word line is changed from an insulating film including a charge storage film to an insulating film not including a charge storage film, and a resistance change material is embedded on an inner side the cylindrical semiconductor portion, which thereby allows a resistance change type memory cell array to be three-dimensionally constituted. In this configuration, when the cell transistor of the selected memory cell is selectively turned off, the resistance change element of the selected memory cell can be accessed. Thus, the configuration can be formed in similar manner to the three-dimensional flash type memory cell array by stacking a plurality of word line layers, forming holes by collective etching, and embedding an insulating film, a semiconductor portion, and a resistance change material, and thus achieve a substantial reduction in cost.

Figure 3:
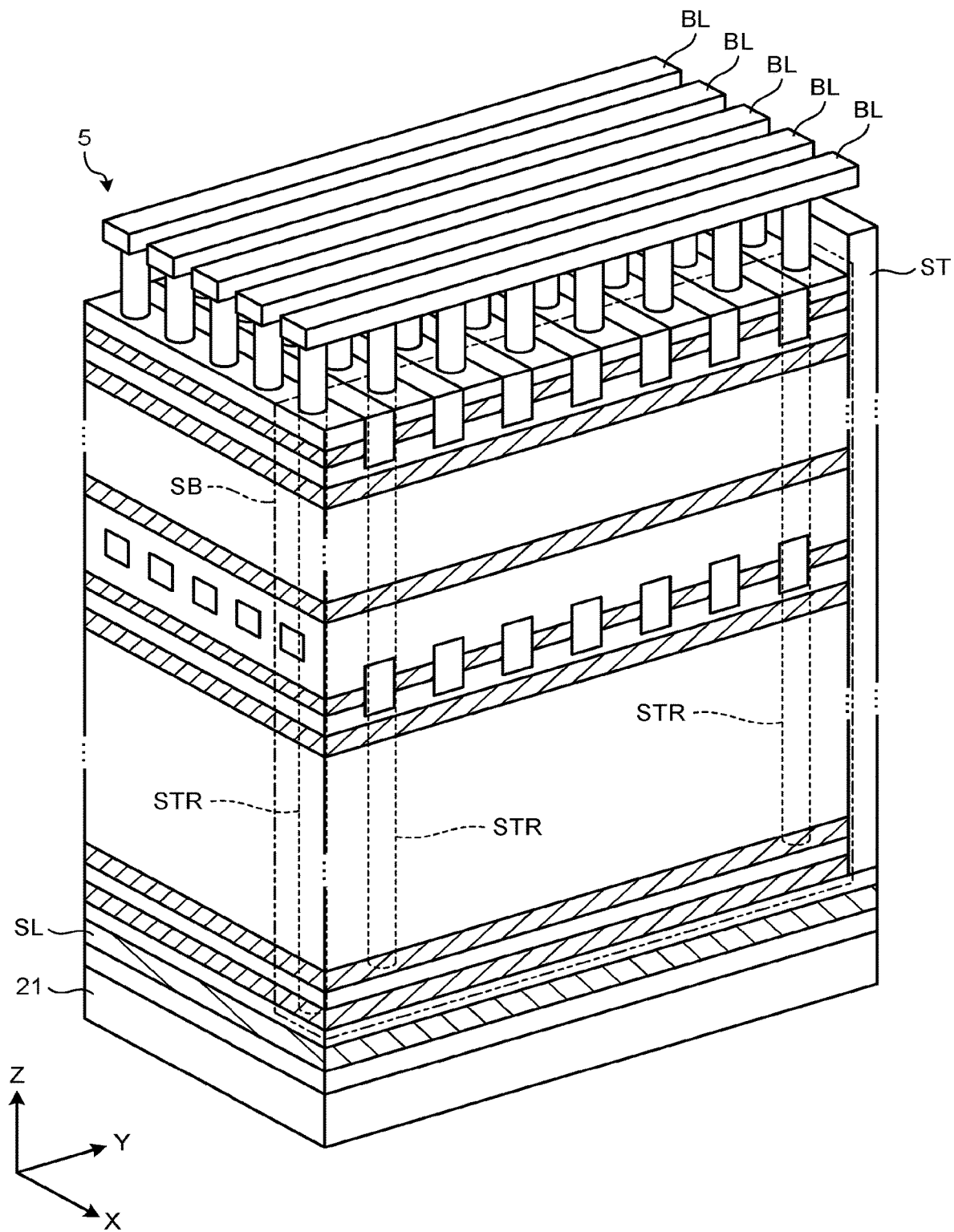
FIG. 3 is a perspective view illustrating a configuration of a memory cell array in the first embodiment.
Figure 4:
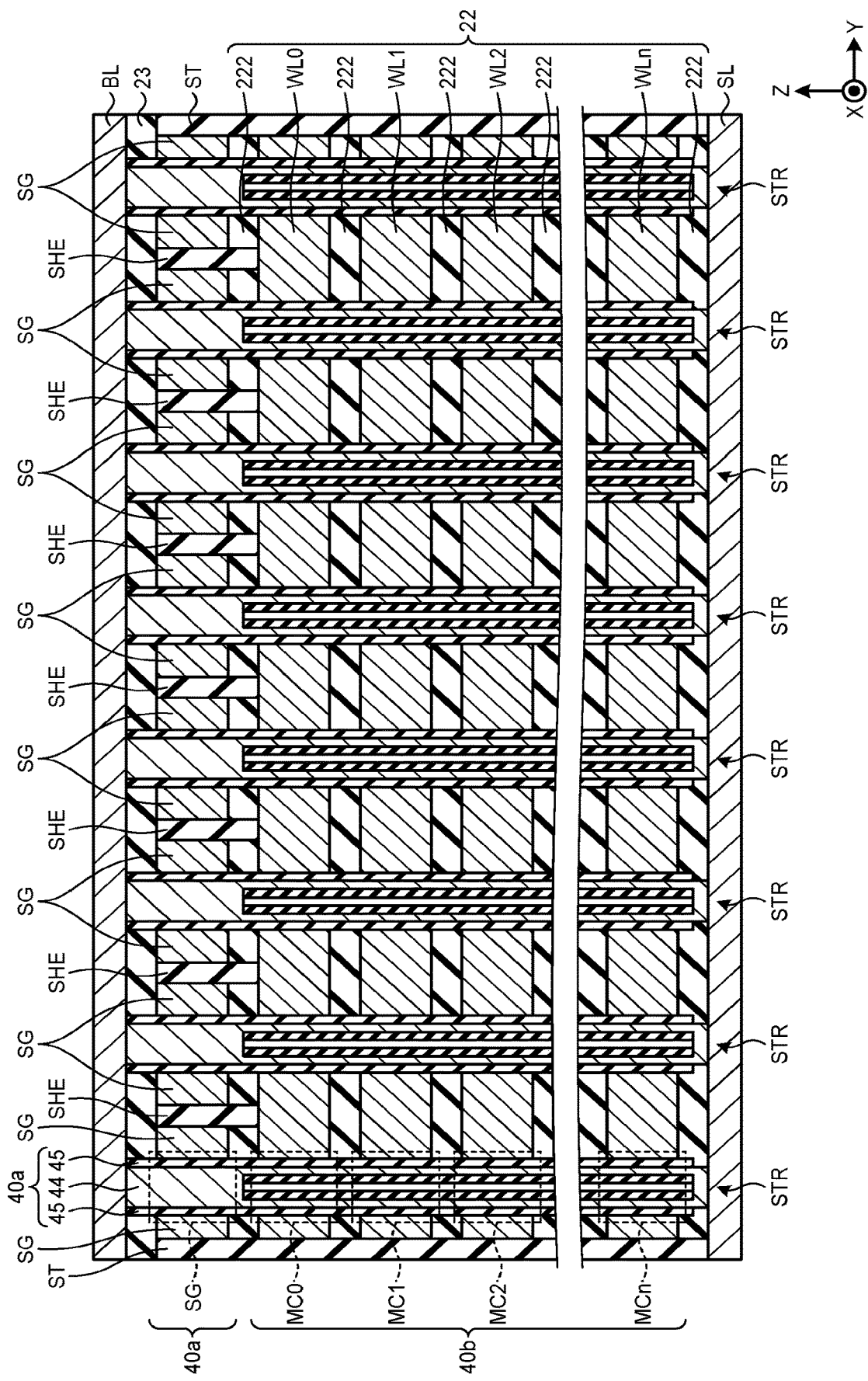
FIG. 4 is a cross-sectional view illustrating the configuration of the memory cell array in the first embodiment.

For example, the memory cell array 5 may be configured as illustrated in FIGS. 3 and 4. FIG. 3 is a perspective view illustrating the schematic configuration of the memory cell array 5. FIG. 4 is a cross-sectional view illustrating the configuration of the memory cell array 5. In FIGS. 3 and 4, the extending direction of the bit line BL is the Y direction, the stacking direction of the memory cell transistors MC is the Z direction, and the direction perpendicular to the Y direction and the Z direction is the X direction. In the memory cell array 5, as illustrated in FIG. 3, columnar strings STR are two-dimensionally arranged in the XY direction on the +Z side of a substrate 21, and a stacked body 22 is penetrated by the columnar strings STR to form a three-dimensional array of memory cells.

The source line SL is composed of a plate-like conductive film extending in the XY direction. The source line SL may be formed of a material mainly composed of metal or may be constituted of a semiconductor imparted with conductivity. Alternatively, although not illustrated, the source line SL may be disposed near the surface of the substrate 21 and formed of a semiconductor region containing impurities and having conductivity. The source line SL can be supplied with a predetermined potential from the peripheral circuit 8.

A plurality of stacked bodies including the stacked body 22 can be disposed on the +Z side of the substrate 21. The plurality of stacked bodies can be disposed at a position shifted from each other in the Y direction with separation portions ST therebetween. In the separation portion ST, at least a surface in contact with the stacked body 22 is formed of an insulating material, and the stacked body 22 is electrically separated from other stacked bodies. The separation portion ST has a substantially fin shape extending along the XZ direction. Note that although not illustrated, the separation portion ST may be formed to have two flat insulating portions in the XZ direction and a flat electrode portion in the XZ direction sandwiched between the two insulating portions. The electrode portion may be used as part of predetermined wiring for supplying a voltage to the source line SL.

In the stacked body 22, the word lines WL and insulating layers 222 are alternately and repeatedly stacked. The word line WL is composed of a plate-like conductive film extending in the XY direction. In the stacked body 22, a plurality of word lines WL is disposed apart from each other in the Z direction. Each word line WL can be formed of a material mainly composed of a conductive material (e.g., metals such as tungsten). Each insulating layer 222 can be formed of a material mainly composed of an insulator (e.g., silicon oxide).

A string selection line SG is stacked on the uppermost insulating layer 222 of the stacked body 22. The string selection line SG is composed of a plate-like conductive film extending in the XY direction. The string selection line SG can be formed of a material mainly composed of a conductive material (e.g., metals such as tungsten). Each string selection line SG is partitioned in the Y direction by a partition film SHE. The partition film SHE is provided above (+Z side) the word line WL, extends in the Y direction and the Z direction, and reaches the uppermost insulating layer 222 of the stacked body 22. The partition film SHE can be formed of an insulator (e.g., silicon oxide). Thus, the string selection lines SG are electrically isolated from each other.

The string STR is columnar and penetrates the stacked body 22 in the Z direction. Each string STR extends in the Z direction. The plurality of strings STR can be arranged two-dimensionally in the XY direction (see FIG. 13). Each string SIR includes a columnar main portion 40*b*, a portion crossing the columnar main portion 40*b* of the word line WL, a columnar upper portion 40*a*, and a portion crossing the columnar upper portion 40*a* of the string selection line SG. The columnar upper portion 40*a* is disposed on the +Z side of the columnar main portion 40*b* and is connected to the columnar main portion 40*b*.

The string selection transistor SG is formed at a position where the columnar upper portion 40*a* intersects the string selection line SG. The cell transistor MT of the memory cell MC is formed at a position where the columnar main portion 40*b* intersects the word line WL.

Figure 5A:
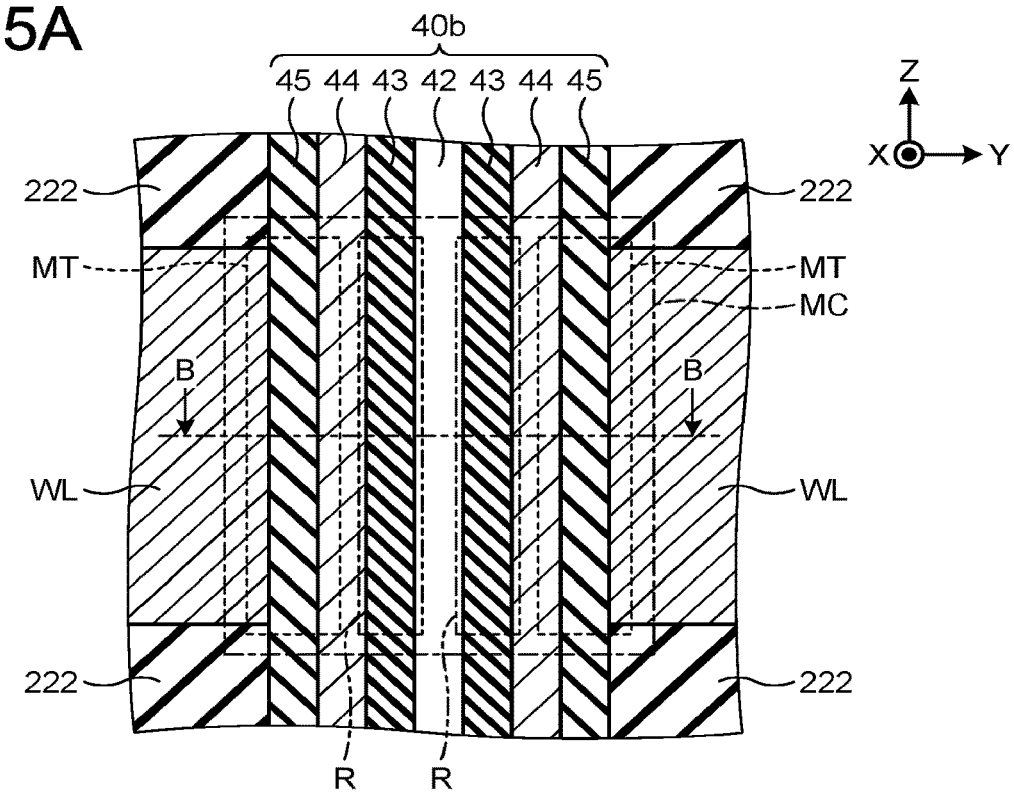
FIGS. 5A to 5C are a cross-sectional view, a plan view, and a circuit diagram illustrating a configuration of a memory cell in the first embodiment.
Figure 5B:
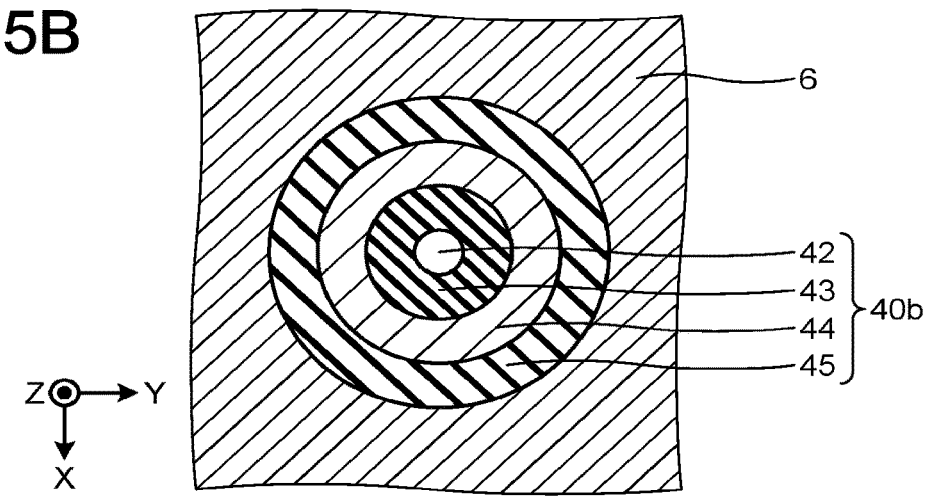
Figure 5C:
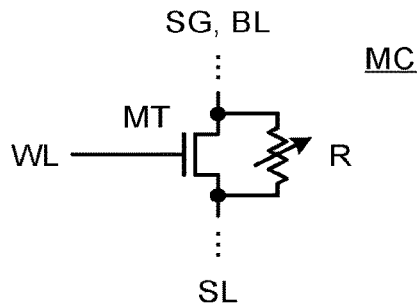

As illustrated in FIGS. 5A and 5B, the columnar main portion 40b has a core insulating film 42, a resistance change material film 43, a semiconductor film 44, and an insulating film 45. FIG. 5A is a cross-sectional view illustrating the configuration of the memory cell MC. FIG. 5B is a plan view illustrating the configuration of the memory cell MC, and illustrates a cross section when FIG. 5A is cut along the line B-B. FIG. 5C illustrates an equivalent circuit of each memory cell MC.

The core insulating film 42 is disposed near the central axis of the string STR and extends along the central axis of the string STR. The core insulating film 42 can be formed of a material mainly composed of an insulator (e.g., silicon oxide). The core insulating film 42 has a substantially I-shape in a ZY cross-sectional view and a substantially I-shape in a ZX cross-sectional view.

The resistance change material film 43 is disposed between the core insulating film 42 and the word line WL, is disposed so as to surround the core insulating film 42 from the outside, and extends along the central axis of the string STR. The resistance change material film 43 can be formed of a material exhibiting resistance change characteristics due to phase change. For example, the resistance change material film 43 can be formed of a chalcogenide-based material (Ge, Sb, and Te). The resistance change material film 43 is a substantially columnar and has a substantially cylindrical shape.

The semiconductor film 44 is disposed between the resistance change material film 43 and the word line WL, and is disposed so as to surround the resistance change material film 43 from the outside, and extends along the central axis of the string STR. The semiconductor film 44 can be formed of a material mainly composed of a semiconductor (e.g., polysilicon). The semiconductor film 44 has a substantially cylindrical shape. The lower end (end on the −Z side) of the semiconductor film 44 is electrically connected to the semiconductor film 41.

The insulating film 45 is disposed between the semiconductor film 44 and the word line WL, is disposed so as to surround the resistance change material film 43 from the outside, and extends along the central axis of the string STR. The insulating film 45 can be formed of a material mainly composed of an insulator (e.g., silicon oxide).

In the columnar main portion 40b, a region crossing the word line WL functions as the memory cell MC as illustrated by a dashed-dotted line in FIG. 5A. In the region functioning as the memory cell MC, as illustrated by a dotted line in FIG. 5A, a portion where the word line WL/insulating film 45/semiconductor film 44 is stacked in the radial direction of the string STR functions as the cell transistor MT (see FIG. 5C), and as illustrate by a two-dot chain line in FIG. 5A, the resistance change material film 43 functions as the resistance change element R (see FIG. 5C).

The columnar upper portion 40a illustrated in FIG. 4 is disposed on the columnar main portion 40b (on the +Z side). The columnar upper portion 40a extends from a Z position between the word line WL0 and the string selection line SG to a Z position higher than the string selection line SG. The string selection transistor SG is formed at a position where the columnar upper portion 40a intersects the string selection line SG. The columnar upper portion 40a has a semiconductor film 44 and an insulating film 45.

An interlayer insulating film 23 is disposed on the string selection line SG (on the +Z side). The interlayer insulating film 23 can be formed of a material mainly composed of an insulator (e.g., silicon oxide).

The bit line BL is disposed on the interlayer insulating film 23. The bit line BL is composed of a conductive film having a line shape extending in the Y direction. The bit line BL can be formed of a material mainly composed of a conductive material (e.g., metals such as tungsten, copper, and aluminum).

A contact plug not illustrated may be disposed between the bit line BL and the semiconductor film 44. In this case, the contact plug is in contact with the bit line BL at its upper end, and is in contact with the semiconductor film 44 at its lower end, so that the bit line BL and the semiconductor film 44 can be electrically connected. The contact plug can be formed of a material mainly composed of a conductive material (e.g., metals such as tungsten).

In the structure of the three-dimensional memory illustrated in FIGS. 3 and 4, in order to switch the phase change element R, the material of the semiconductor film 44 serving as the channel of the cell transistor MT is formed of, for example, polysilicon having a low mobility because of three-dimensional stack. Therefore, if the number of stacked word lines WL is increased, the resistance of the channel region, which is the path of the cell current, tends to increase, and the cell current flowing through the string STR tends to be insufficient.

Figure 6:
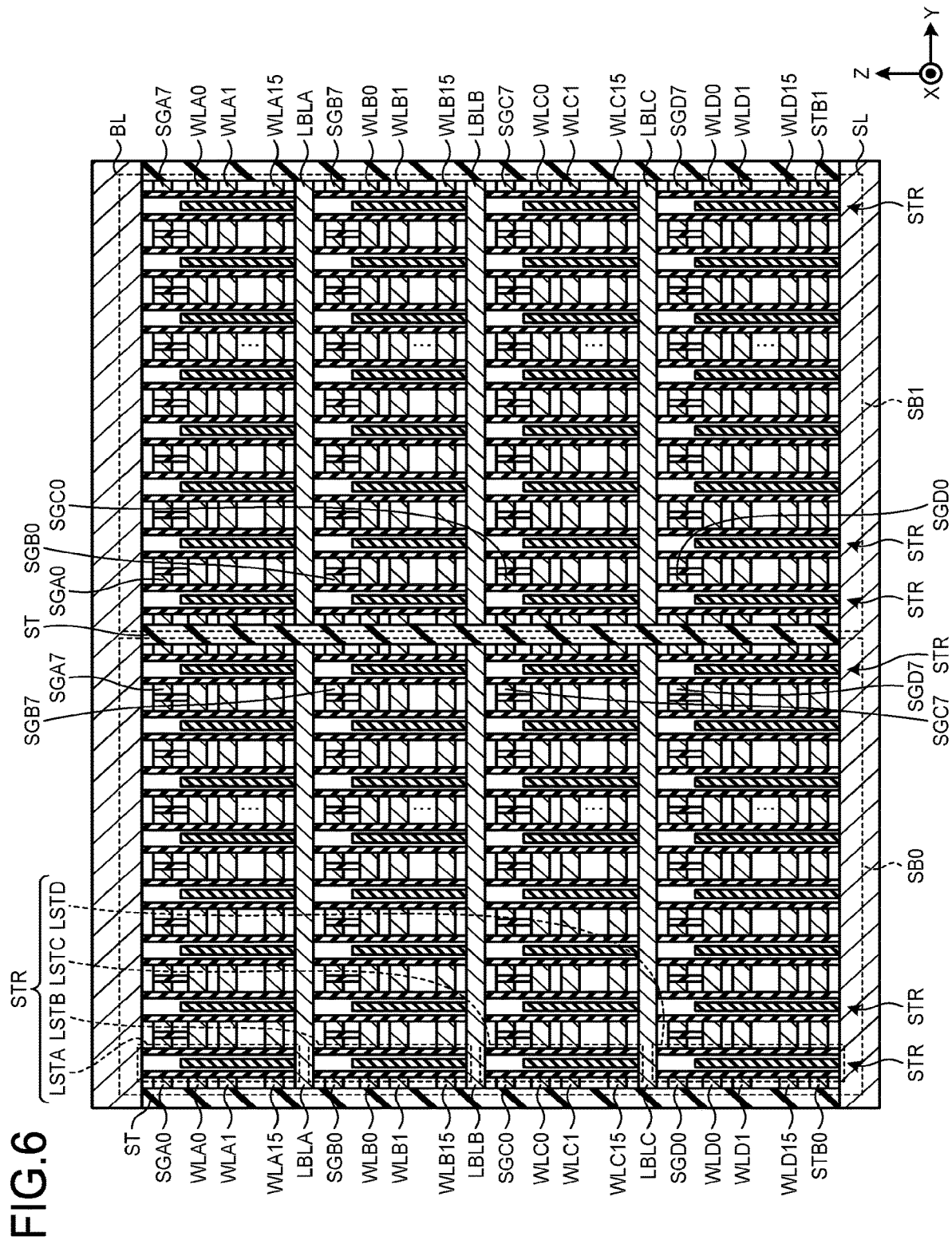
FIG. 6 is a circuit diagram illustrating a configuration of a string block, a local bit line, and a local string block in the first embodiment.
Figure 7:
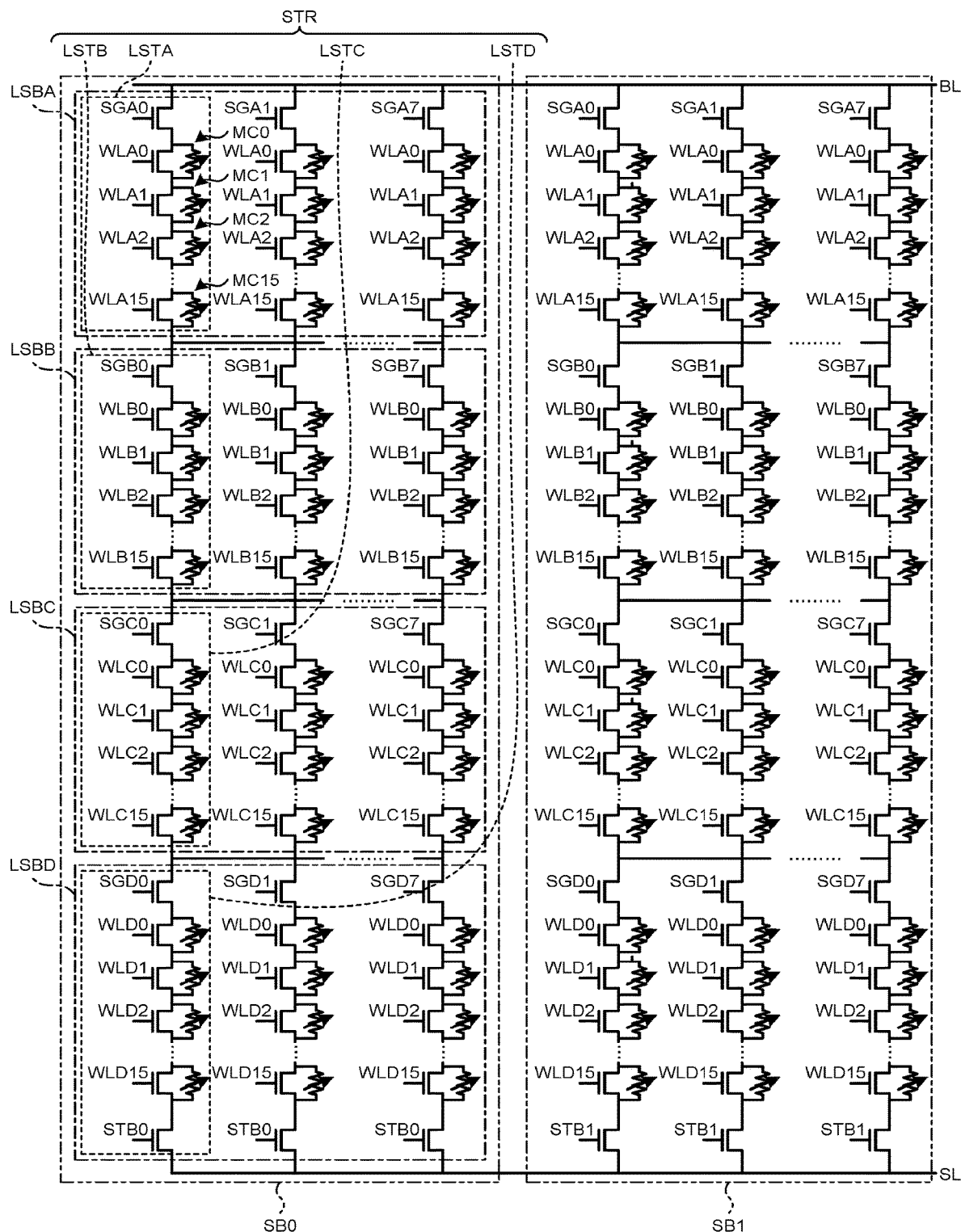
FIG. 7 is a cross-sectional view illustrating the configuration of the string block, the local bit line, and the local string block in the first embodiment.

For this problem, as illustrated in FIGS. 6 and 7, it is conceivable to divide the string STR into a plurality of tiers, and to connect the plurality of adjacent tiers in the planar direction in parallel by a local bit line, thereby reducing the resistance of the channel region. Thus, it is expected that the cell current flowing in the string STR can be secured.

Specifically, as illustrated in FIG. 3, a unit including a plurality of strings STR connected to the identical bit line BL and arranged in the bit line BL direction (Y direction) between the separation portions ST will be referred to as a string block SB. The YZ cross-sectional view of FIG. 6 illustrates a configuration in which two string blocks SB0 and SB1 are adjacent in the Y direction and eight strings STR are arranged in the Y direction in each string block SB.

As illustrated in FIGS. 6 and 7, each string STR is divided into a plurality of tiers. Each tier will be referred to as a local string LST. Each string STR is divided into a plurality of local strings LSTA, LSTB, LSTC, and LSTD. In each string STR, the local string LSTD, the local string LSTC, the local string LSTB, and the local string LSTA are stacked in the Z direction in this order on the +Z side of the source line SL.

A plurality of local bit lines LBLA, LBLB, and LBLC is inserted between the plurality of local strings LSTA, LSTB, LSTC, and LSTD. Each of the local bit lines LBLA, LBLB, and LBLC extends in the Y direction.

The local bit line LBLA is connected to a plurality of (e.g., eight) local strings LSTA arranged in the Y direction on the +Z side and connects the local strings in parallel. The local bit line LBLA is connected to a plurality of local strings LSTB arranged in the Y direction on the −Z side and connects the local strings in parallel.

The local bit line LBLB is connected to the plurality of local strings LSTB arranged in the Y direction on the +Z side and connects the local strings in parallel. The local bit line LBLB is connected to the plurality of local strings LSTC arranged in the Y direction on the −Z side and connects the local strings in parallel.

The local bit line LBLC is connected to the plurality of local strings LSTC arranged in the Y direction on the +Z side and connects the local strings in parallel. The local bit line LBLC is connected to the plurality of local strings LSTD arranged in the Y direction on the −Z side and connects the local strings in parallel.

A set of the plurality of (e.g., eight) local strings LSTA arranged in the Y direction will be referred to as a local string block LSBA. Similarly, a set of the plurality of local strings LSTB arranged in the Y direction will be referred to as a local string block LSBB, a set of the plurality of local strings LSTC arranged in the Y direction will be referred to as a local string block LSBC, and a set of the plurality of local strings LSTD arranged in the Y direction will be referred to as a local string block LSBD.

In other words, both ends in the Z direction of the plurality of local strings LST arranged in the bit line direction (Y direction) are connected to the local bit lines LBL to constitute a local string block LSB. A plurality of local string blocks LSB is connected in series in the Z direction to constitute a string block SB.

When the string STR is divided into the plurality of local strings LSTA, LSTB, LSTC, and LSTD, the string selection line SG is divided into a plurality of local string selection lines SGA, SGB, SGC, and SGD, and the string selection transistor SG is divided into local string selection transistors SGA, SGB, SGC, and SGD.

In the local string LSTA, a plurality of memory cells MC0 to MC15 is constituted at a position crossing a plurality of word lines WLA0 to WLA15. In each of the plurality of local strings LSTA, the bit line BL is connected to one end of the plurality of memory cells MC0 to MC15 connected in series via local string selection transistors SGA0 to SGA7. The gates of the plurality of local string selection transistors SGA0 to SGA7 are connected to local string selection lines SGA0 to SGA7, respectively. The plurality of local string selection lines SGA0 to SGA7 is electrically isolated from each other through the partition film SHE. The local string selection lines SGA0 to SGA7 are supplied with control signals independent of each other. Thus, the plurality of local strings LSTA can be selected, respectively, by turning on the local string selection transistor SGA through the local string selection line SGA.

In the local string LSTB, a plurality of memory cells MC0 to MC15 is constituted at a position crossing a plurality of word lines WLB0 to WLB15. In each of the plurality of local strings LSTB, the local bit line LBLA is connected to one end of the plurality of memory cells MC0 to MC15 connected in series via local string selection transistors SGB0 to SGB7. The gates of the plurality of local string selection transistors SGB0 to SGB7 are connected to local string selection lines SGB0 to SGB7, respectively. The plurality of local string selection lines SGB0 to SGB7 is electrically isolated from each other through the partition film SHE. The plurality of local string selection lines SGB0 to SGB7 is supplied with control signals independent of each other. Thus, the plurality of local strings LSTB can be selected, respectively, by turning on the local string selection transistor SGB through the local string selection line SGB.

In the local string LSTC, a plurality of memory cells MC0 to MC15 is constituted at a position crossing a plurality of word lines WLC0 to WLC15. In each of the plurality of local strings LSTC, the local bit line LBLB is connected to one end of the plurality of memory cells MC0 to MC15 connected in series via local string selection transistors SGC0 to SGC7. The gates of the plurality of local string selection transistors SGC0 to SGC7 are connected to local string selection lines SGC0 to SGC7, respectively. The plurality of local string selection lines SGC0 to SGC7 is electrically isolated from each other through the partition film SHE. The plurality of local string selection lines SGC0 to SGC7 is supplied with control signals independent of each other. Thus, the plurality of local strings LSTC can be selected, respectively, by turning on the local string selection transistor SGC through the local string selection line SGC.

In the local string LSTD, a plurality of memory cells MC0 to MC15 is constituted at a position crossing a plurality of word lines WLD0 to WLD15. In each of the plurality of local strings LSTD, the local bit line LBLC is connected to one end of the plurality of memory cells MC0 to MC15 connected in series via local string selection transistors SGD0 to SGD7. The gates of the plurality of local string selection transistors SGD0 to SGD7 are connected to local string selection lines SGD0 to SGD7, respectively. The plurality of local string selection lines SGD0 to SGD7 is electrically isolated from each other through the partition film SHE. The plurality of local string selection lines SGD0 to SGD7 is supplied with control signals independent of each other. Thus, the plurality of local strings LSTD can be selected, respectively, by turning on the local string selection transistor SGD through the local string selection line SGD.

For example, as illustrated in FIG. 7, when the uppermost local string block LSBA is selected to perform read and write operations, all the cell transistors MT and all the local string selection transistors SG of all the lower unselected local string blocks LSB not including the selected memory cell MC in the selected string block SB0 are turned on. The on-state allows current to flow from the local bit line LBL to the further lower local bit line LBL via the plurality of unselected local strings LST, thereby significantly reducing the parasitic resistance of the plurality of unselected local string blocks LSB, and consequently significantly increasing the current flowing to the two-terminal resistance change storage element of the selected memory cell MC, and conversely, at the identical cell current, significantly increasing the substantial number of stacked word lines of the string block SB. In other words, since the number of stacked word lines can be increased, a large cost reduction can be realized.

However, when the resistance change element R, which operates at a high speed, such as a phase change element, is applied to a three-dimensional memory cell array structure as illustrated in FIGS. 6 and 7, the structure is optimized at a low speed and the delay of the word line and the bit line is large, so that the delay can be bottlenecked and the performance improvement can be insufficient.

Figure 8:
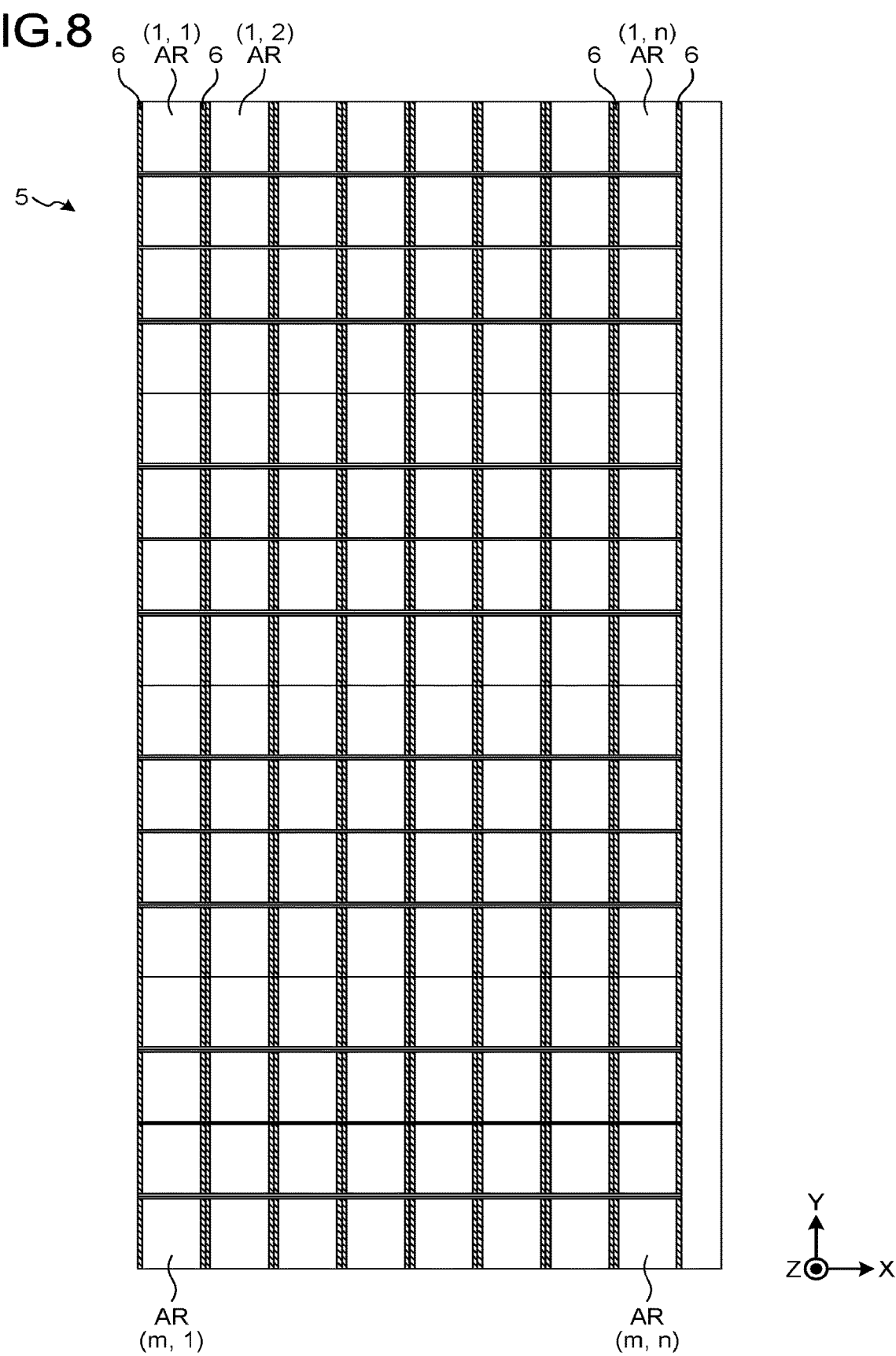
FIG. 8 is a plan view illustrating a layout configuration of the memory cell array and a row decoder in the first embodiment.

On the other hand, in order to take advantage of the high speed of the resistance change element R such as the phase change element, it is effective to subdivide the memory cell array 5 into a plurality of sub-arrays as illustrated in FIG. 8. In each sub-array, the length of the word line WL and the bit line BL is shorter than that of the memory cell array 5 before division, and the wiring delay thereof can be greatly reduced. FIG. 8 is a plan view illustrating the layout configuration of the memory cell array 5 and the row decoder 6. FIG. 8 illustrates a configuration in which the memory cell array 5 is divided into sub-arrays AR (1, 1) to AR (m, n) of m rows by n columns. Accordingly, as illustrated by hatched lines in FIG. 8, circuits for driving local string lines and word lines in the row decoder 6 can be divided and disposed at the end of the +X side or the −X side of each sub-array AR. Thus, the circuit scale of the row decoder 6 may increase and the circuit area thereof may increase. As the circuit area of the row decoder 6 increases, the total cost of the nonvolatile semiconductor memory device 1 may increase.

As a countermeasure, in the memory cell array 5, a block selection line STB and a block selection transistor STB are added as control lines for selecting in units of the string block SB. In other words, in each string block SB, the block selection transistor STB is added to each local string LST in one local string block LSB of the plurality of local string blocks LSB. The block selection line STB is connected to the gate of the block selection transistor STB.

The signals of the two word lines WL connected to the two adjacent string blocks SB in the bit line BL direction (Y direction) are then used as common signals. Thus, the scale of the circuit for generating the signal of the word line WL in the row decoder 6 can be reduced, and the circuit area of the row decoder 6 can be reduced. Thus, the larger the number of stacked word lines WL that pass through the string block SB, the more effectively the circuit scale can be reduced.

The signals of the two block selection lines STB connected to the two string blocks SB are independent of each other. Thus, each memory cell MC can be selected by switching the selection/non-selection of the string block SB and the selection/non-selection of the local string LST, while using the signals of the two word lines WL connected to the two string blocks SB as a common signal. Note that since the block selection line STB passing through the string block SB has one layer, this layer has little influence on the circuit scale.

Specifically, as illustrated in FIGS. 6 and 7, for the plurality of adjacent string blocks SB0 and SB1 in the Y direction, the signals of the adjacent word lines WL in the Y direction are used as a common signal. For example, the word line WLA0 of the string block SB0 and the word line WLA0 of the string block SB1 are used as a common signal. The word line WLA1 of the string block SB0 and the word line WLA1 of the string block SB1 are used as a common signal. The word line WLD15 of the string block SB0 and the word line WLD15 of the string block SB1 are used as a common signal.

In the string block SB0, a block selection line STB0 is added between the source line SL and the lowermost word line WLD15. The block selection line STB0 is composed of a plate-like conductive film extending in the XY direction. In the lowermost local string LSTD in the string block SB0, the source line SL is connected to one end of the plurality of memory cells MC0 to MC15 connected in series via a block selection transistor STB0, and the block selection line STB0 is connected to the gate of the block selection transistor STB0. In the block selection line STB0, the block selection transistors STB0 are each constituted at a position crossing a plurality of (in FIG. 6, eight) local strings LSTD arranged in the Y direction in the local string block LSBD. The block selection line STB0 is commonly connected to the block selection transistors STB0 of the plurality of local strings LSTD arranged in the Y direction.

In the string block SB1, a block selection line STB1 is added between the source line SL and the lowermost word line WLD15. The block selection line STB1 is composed of a plate-like conductive film extending in the XY direction. In the lowermost local string LSTD in the string block SB1, the source line is connected to one end of a plurality of memory cells MC0 to MC15 connected in series via a block selection transistor STB1, and the block selection line STB1 is connected to the gate of the block selection transistor STB1. In the block selection line STB1, the block selection transistors STB1 are each constituted at a position crossing a plurality of (in FIG. 6, eight) local strings LSTD arranged in the Y direction in the local string block LSBD. The block selection line STB1 is commonly connected to the block selection transistors STB1 of the plurality of local strings LSTD arranged in the Y direction.

For the plurality of adjacent string blocks SB0 and SB1 in the Y direction, the signals of the adjacent block selection lines STB0 and STB1 in the Y direction are used independently of each other. Thus, the block selection transistor STB0 of the string block SB0 and the block selection transistor STB1 of the string block SB1 can be turned on and off independently of each other. Thus, the string blocks SB0 and SB1 can be selected independently of each other.

Figure 9:
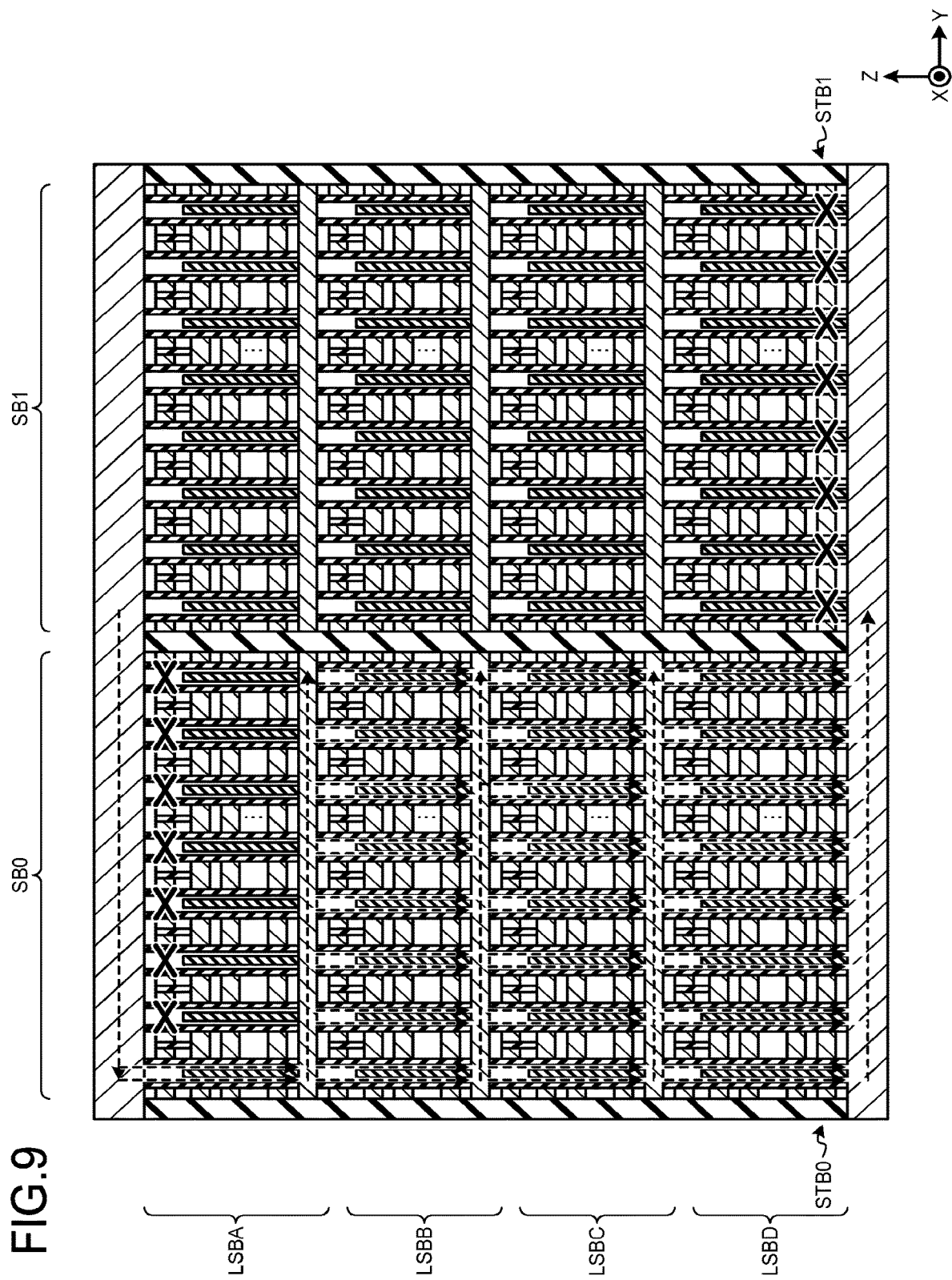
FIG. 9 is a cross-sectional view illustrating an operation of the nonvolatile semiconductor memory device according to the first embodiment.
Figure 10:
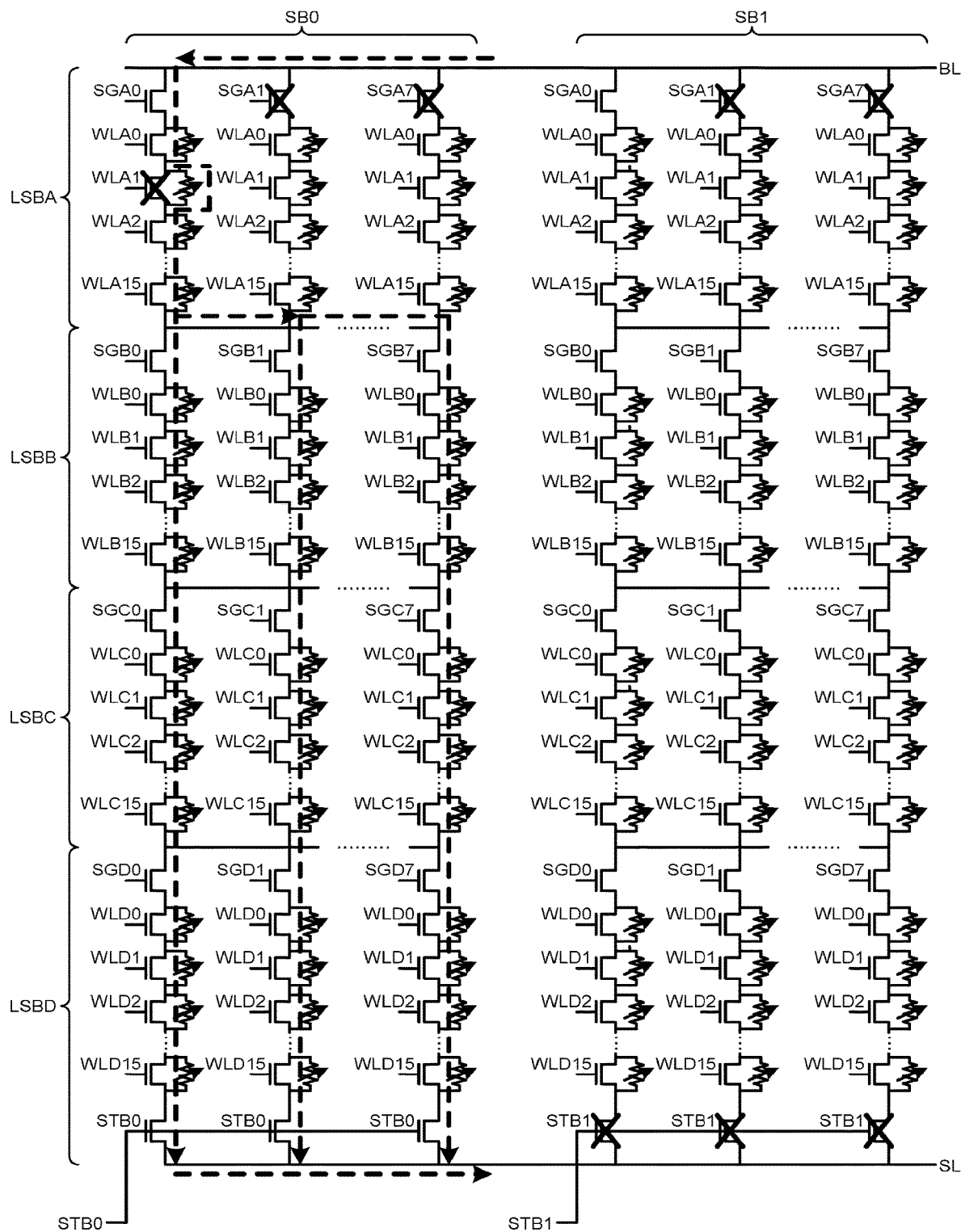
FIG. 10 is a circuit diagram illustrating the operation of the nonvolatile semiconductor memory device according to the first embodiment.

For example, as illustrated in FIGS. 9 and 10, when the second memory cell MC from the top left of the uppermost local string block LSBA in the string block SB0 is accessed, then WLA1=Low, WLA0=WLA2 to WLA15=High, SGA0=High, and SGA1 to SGA7=Low. Thus, a current selectively flows to the leftmost local string LSTA of the plurality of local strings LSTA in the uppermost local string block LSBA. In the leftmost local string LSTA, the cell transistor MT connected to the word line WLA1 is selectively turned off, of the cell transistors MT connected to the word lines WLA0 to WLA15. Therefore, when a voltage is applied to the bit line BL and the source line SL, a current flows selectively to the resistance change element R corresponding to the word line WLA1 in the leftmost local string LSTA in the local string block LSBA, of a plurality of resistance change elements R in the local string block LSBA, and reading/writing to the resistance change element R can be realized.

In such a case, the local string selection lines SGB, SGC, and SGD, and the word lines WLB, WLC, and WLD of all the local string blocks LSBB, LSBC, and LSBD lower than the uppermost local string block LSBA of the string block SB0 are set to the on-state potential. In other words, SGAB0 to SGAB7, WLB0 to WLB15, AGC0 to AGC7, WLC0 to WLC15, SGD0 to SGD7, and WLD0 to WLD15=High (see FIG. 6). The upper end of the local string LSTB of the local string block LSBB is connected by the local bit line LBLA, the upper end of the local string LSTC of the local string block LSBC is connected by the local bit line LBLB, and the upper end of the local string LSTC of the local string block LSBC is connected by the local bit line LBLC. Therefore, in the current path from the bit line BL to the source line SL, the resistances of each of all the local string blocks LSBB to LSBD lower than the uppermost local string block LSBA can be reduced to a fraction of the resistances of one local string LST because the local string LST is connected in parallel by the local bit line LBL. Thus, while the semiconductor film 43 (see FIG. 5A) formed of, for example, polysilicon having low mobility is used as the channel region of the cell transistor MT, a current sufficient to switch the resistance change element R of the selected memory cell MC can be made to flow. Therefore, the configuration in which the local bit line LBL is provided can reduce the resistance to the length of the current path from the bit line BL to the source line SL as compared with the configuration in which the local bit line LBL is not provided. Conversely, the configuration in which the local bit line LBL is provided can flow the same amount of current as compared with the configuration in which the local bit line LBL is not provided, even if the current path from the bit line BL to the source line SL is longer in the former configuration. Accordingly, the total number of stacked word lines WL can be increased while securing the characteristics of the nonvolatile semiconductor memory device 1, so that the cost for the storage capacity of the nonvolatile semiconductor memory device 1 can be reduced.

Further, in the present embodiment, a block selection transistor STB is inserted in series into each of the local strings LST included in one (in this example, in the lowermost local string block LSBD) of the plurality of local string blocks LSB. A block selection line STB is collectively connected to the gate of each block selection transistor STB for each string block SB. In other words, the block selection line STB assigns an independent signal to each string block SB.

For example, in FIGS. 9 and 10, a signal STB0 is assigned to the block selection line STB0 of the left string block SB0, and a signal STB1 is assigned to the block selection line STB1 of the right string block SB1. A block selection line STB0 is commonly connected to block selection transistors STB0 of a plurality (e.g., eight) of local strings LSTD in the local string block LSBD of the string block SB0. A block selection line STB1 is commonly connected to block selection transistors STB1 of a plurality of local strings LSTD in a local string block LSBD of a string block SB1.

This structure allows selective access to either the string block SB0 or the string block SB1 while driving the word line WLA0, which is a layer formed by the same process in the string block SB0 and the string block SB1, with a common signal. Similarly, WLA1 to WLA15, WLB0 to WLB15, WLC0 to WLC15, and WLD0 to WLD15 can be used as a common signal in the string block SB0 and the string block SB1, respectively.

The local string selection line SGA0, which is the corresponding conductive film among the layers formed by the same process in the string block SB0 and the string block SB1, can be driven by a common signal. Similarly, the local string selection lines SGA1 to SGA7, AGB0 to AGB7, SGC0 to SGC7, and SGD0 to SGD7 can be used as a common signal in the string block SB0 and the string block SB1, respectively.

For example, STB0=High selects the string block SB0, and WLA1=Low, WLA0, WLA2 to WLA15=High, and SGA0=high selects the leftmost local string LSTA of the uppermost local string block LSBA. In this case, no current flows in the other local strings LST in the same string block SB0 because SGA1 to SGA7=Low, and no current flows in each local string LST in the other string block SB1 because STB1=Low. In another string block SB1, the word lines WLA, WLB, WLC, and WLD, and the local string selection transistors SGA, SGB, SGC, and SGD operate in the same manner as in the string block SB0. However, since the signal of the block selection line is STB1=Low, each string current is cut off by the lowermost string selection transistor STB1.

Thus, in the present embodiment, the word line signals WLA, WLB, WLC, and WLD and the local string selection signals SGA, SGB, SGC, and SGD can be shared by a plurality of adjacent string blocks SB0 and SB1, respectively. Thus, even if the cell array size is subdivided for the high-speed operation as illustrated in FIG. 8, the number of word line driving circuits and local string selection line circuits arranged in the row decoder can be reduced by the shared number, and both high-speed operation and a chip area reduction can be achieved.

As described above, in the first embodiment, for the plurality of adjacent string blocks SB in the bit line BL direction, the plurality of stacked word lines WLA, WLB, WLC, and LWD in each string block SB is used as a common signal with the word lines of the same layer (or the same height) of the adjacent string blocks SB. Each local string selection line SGA, SGB, SGC, and SGD in each local string LST in each string block SB is used as a common signal with a corresponding local string selection line in the same layer (or the same height) of the adjacent string blocks SB. On the other hand, in each adjacent string block SB, the block selection line STB is used as an independent signal. Thus, the string block including the block selection transistor, which is turned on from the selected block selection line, can be selectively operated by conduction. Accordingly, the area of the circuit for driving the word lines and the local string selection lines of the plurality of adjacent string blocks used as a common signal can be greatly reduced.

For example, in order to accelerate the operation of the phase change memory (PCM), the word line delay may be reduced by reducing the size of the memory cell array. In this case, since the number of memory cell arrays to be driven is increased, the number of required word line driving circuits and local string selection line driving circuits is increased, and the circuit area may be increased. However, in the configuration of the present embodiment, a plurality of adjacent string blocks SB in the bit line BL direction can be selectively accessed for each string block SB while providing a common signal to each of the word lines WLA, WLB, WLC, and LWD. Therefore, the circuit area required for the word line driving circuit and the local string selection line driving circuit can be reduced. Thus, the cost for the storage capacity of the nonvolatile semiconductor memory device 1 can be reduced.

Note that although not illustrated, each local string LST may have a layer configuration similar to that of the columnar main portion 40b instead of the layer configuration of the columnar upper portion 40a. In this case, the resistance change element is equivalently connected to both ends of the local string selection transistor SG in parallel, but setting the resistance change elements in a high resistance state in advance allows the resistance change elements to be operated in the same manner as the local string selection transistor SG of the first embodiment.

Second Embodiment

A nonvolatile semiconductor memory device 1 according to a second embodiment will then be described. In the following, the description will be focused on parts different from the first embodiment.

While the first embodiment illustrates the configuration of the nonvolatile semiconductor memory device 1, the second embodiment illustrates the operation of the nonvolatile semiconductor memory device 1 in the configuration.

Figure 11:
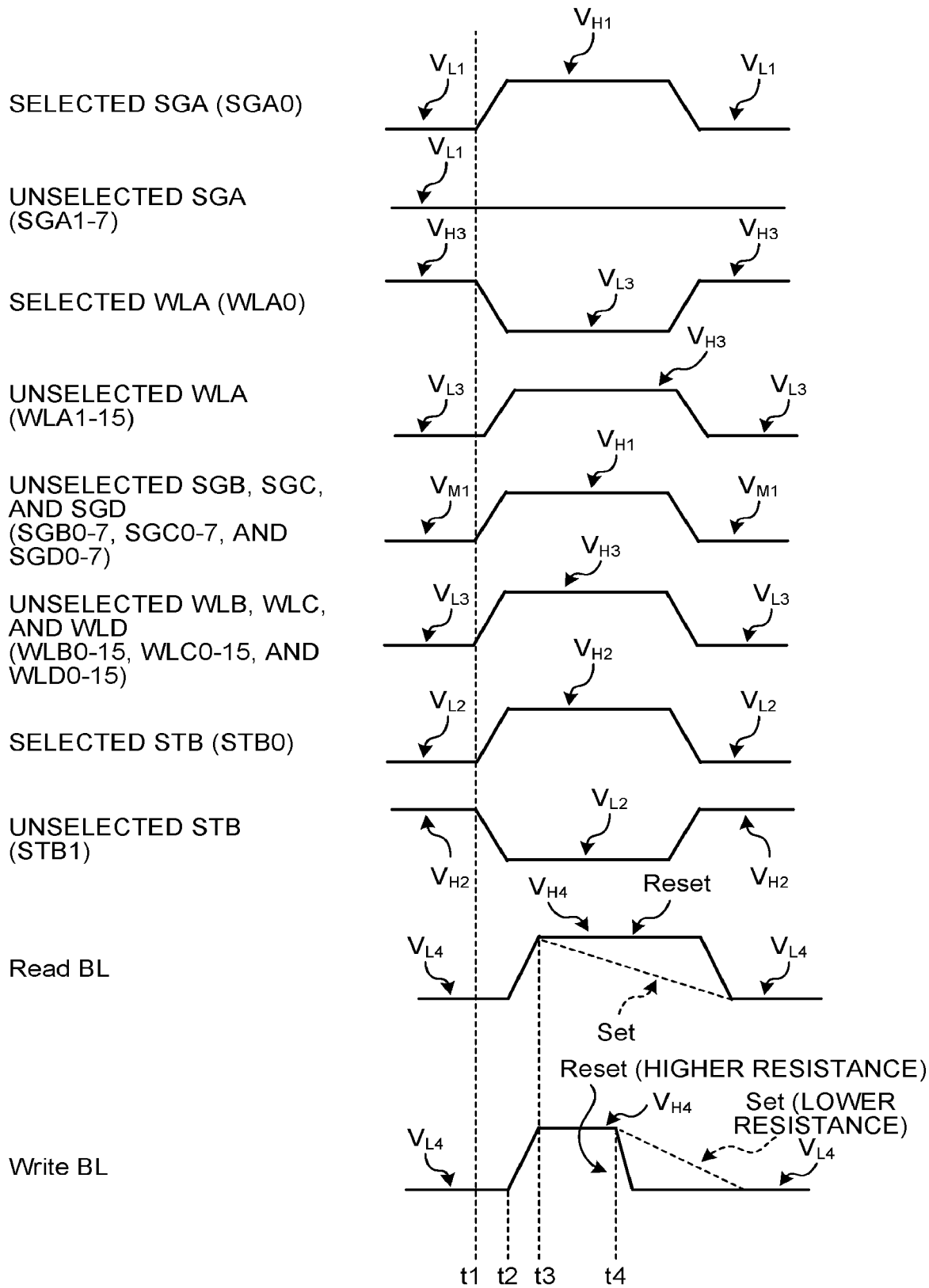
FIG. 11 is a waveform diagram illustrating an operation of a nonvolatile semiconductor memory device according to a second embodiment.

Specifically, the nonvolatile semiconductor memory device 1 can operate as illustrated in FIG. 11. FIG. 11 illustrates an operation example of the string block.

In FIG. 11, the operation during standby is performed before a timing t1. The row decoder 6 precharges the signals of local string selection lines SGA0 to SGA7 of the uppermost local string block LSBA to a low level $V_{L1}$ (e.g., $V_{L1}=0$ V), and the signals of local string selection lines SGB1 to SGB7, SGC1 to SGC7, and SGD1 to SGD7 of the other local string blocks LSBB, LSBC, and LSBD to an intermediate potential $V_{M1}$ (e.g., $V_{L1}<V_{M1}<V_{L1}$).

At the timing t1, the read and write operations are started. The row decoder 6 transits the signal of the block selection line STB0 from the low level $V_{L2}$ to the high level $V_{H2}$ and selects the string block SB0. The row decoder 6 transits the signal of the block selection line STB1 from the high level $V_{H2}$ to the low level $V_{L2}$ and unselects the string block SB1.

Of a plurality of local string selection lines SGA0 to SGA7 of the uppermost local string block LSBA, the signal of the local string selection line SGA0 is transited from the low level $V_{L1}$ to the high level $V_{H1}$, the signals of the other local string selection lines SGA1 to SGA7 are maintained at the low level $V_{L1}$, and for example, the leftmost local string LSTA in FIG. 10 is selected.

When the memory cell MC corresponding to the word line WLA0 is selected, the signal of the word line WLA0 is transited from the high level $V_{H3}$ to the low level $V_{L3}$, and the signals of the other word lines WLA1 to WLA15, WLB0 to WLB15, WLC0 to WLC15, and WLD0 to WLD15 are transited from the low level $V_{L3}$ to the high level $V_{H3}$. In the signal of the word line WLA0, the low level $V_{L3}$ is a selected potential and the high level $V_{H3}$ is an unselected potential.

Thus, the memory cell MC corresponding to the local string selection line SGA0 and the word line WLA0 in the string block SB0 can be accessed. In other words, no current flows between the bit line BL and the source line SL in the unselected string block SB1, a current selectively flows in the local string LSTA of the selected local string block LSBA, and a parallel current flows in the local strings LSTB, LSTC, and LSTD of the other local string blocks LSBB, LSBC, and LSBD, in the selected string block SB0. Thus, when the signal of the block selection line STB0 and the signal of the block selection line STB1 are used independently of each other, the signals of the word lines WLA, WLB, WLC, and WLD and the signals of the local string selection lines SGA, SGB, SGC, and SGD can be shared between the string block SB0 and the string block SB1, and the row decoder area can be reduced.

In a state in which one memory cell MC is selected and a source line SL is fixed at a low level, when a selected bit line BL of a plurality of bit lines BL is raised from the low level $V_{L4}$ to the high level $V_{H4}$ and the remaining bit lines are fixed at the low level $V_{L4}$, a current flows between the selected bit line BL and the source line SL. In the potential of the bit line BL, the high level $V_{H4}$ is a selected potential and the low level $V_{L4}$ is an unselected potential.

At the time of reading, at a timing t3 after the timing t1, the row decoder 6 raises the selected bit line BL from the low level $V_{L4}$ to the high level $V_{H4}$ and then floats the selected bit line BL. In response, when the selected memory cell MC is in the high resistance state (Reset state), the potential of the bit line BL is maintained near the high level $V_{H4}$, which is hard to decrease. Thus, the sense amplifier 7 detects that the potential of the bit line BL is at the high level $V_{H4}$, and "1" is read out from the memory cell MC. When the memory cell MC is in the low resistance state (Set state), the potential of the bit line BL decreases to the low level $V_{L4}$. Thus, the sense amplifier 7 detects that the potential of the bit line BL is at the low level $V_{L4}$, and "0" is read out from the memory cell MC.

At the time of writing, at a timing t2 after the timing t1, the sense amplifier 7 increases the potential of the bit line BL to be written from the low level $V_{L4}$ to the high level $V_{H4}$, and flows a current to the selected memory cell MC.

At the timing t4 after the timing t2, when the sense amplifier 7 rapidly lowers the potential of the bit line BL from the high level $V_{H4}$ to the low level $V_{L4}$, the resistance change element (phase change element) R of the selected memory cell MC is rapidly cooled and amorphized (higher resistance). Thus, the memory cell MC becomes a high resistance state (Reset state), and "1" is written in the memory cell MC. When the sense amplifier 7 slowly lowers the potential of the bit line BL from the high level $V_{H4}$ to the low level $V_{L4}$, the resistance change element (phase change element) R of the selected memory cell MC is slowly cooled and crystallized (lower resistance). Thus, the memory cell MC becomes a low resistance state (Set state), and "0" is written in the memory cell MC.

Each signal can then be returned to its pre-transition level in response to the completion of reading and writing. For example, the signal of the selected local string selection line SGA is returned from the high level $V_{H1}$ to the low level $V_{L1}$. The signal of the selected word line WLA0 is returned from the low level $V_{L3}$ to the high level $V_{H3}$. Signals of unselected word lines WLA1 to WLA15, WLB0 to WLB15, WLC0 to WLC15, and WLD0 to WLD15 are returned from the high level $V_{H3}$ to the low level $V_{L3}$. Signals of unselected local string selection lines SGB, SGC, and SGD are returned from the high level $V_{H1}$ to the intermediate potential $V_{M1}$. Signals of unselected word lines WLA1 to WLA15, WLB0 to WLB15, WLC0 to WLC15, and WLD0 to WLD15 are returned from the high level $V_{H3}$ to the low level $V_{L3}$. The signal of the selected block selection line STB is returned from the high level $V_{H2}$ to the low level $V_{L2}$. The signal of the unselected selection block selection line STB is returned from the low level $V_{L2}$ to the high level $V_{H2}$.

As described above, in the second embodiment, in the nonvolatile semiconductor memory device 1, each of the plurality of local string selection lines in each local string in each string block is used as a common signal with each of the local string selection lines in the same layer of adjacent string blocks, and the block selection line of each string block is used as an independent signal. Thus, the string block including the block selection transistor, which is turned on from the selected block selection line, can be selectively operated to be electrically connected to the block selection line. Accordingly, in the nonvolatile semiconductor memory device 1, one memory cell MC can be selected to perform read and write operations.

Figure 12A:
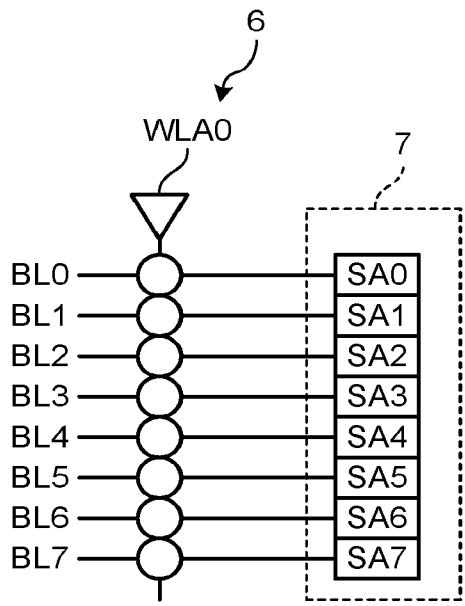
FIGS. 12A to 12C are circuit diagrams illustrating a configuration of a sense amplifier in a modification of the second embodiment.
Figure 12B:
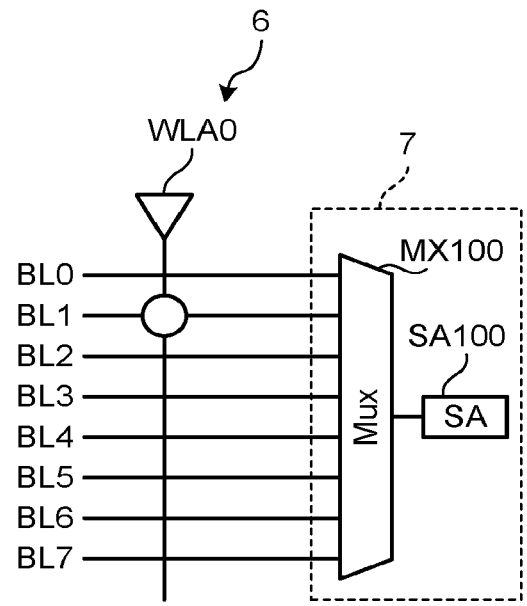
Figure 12C:
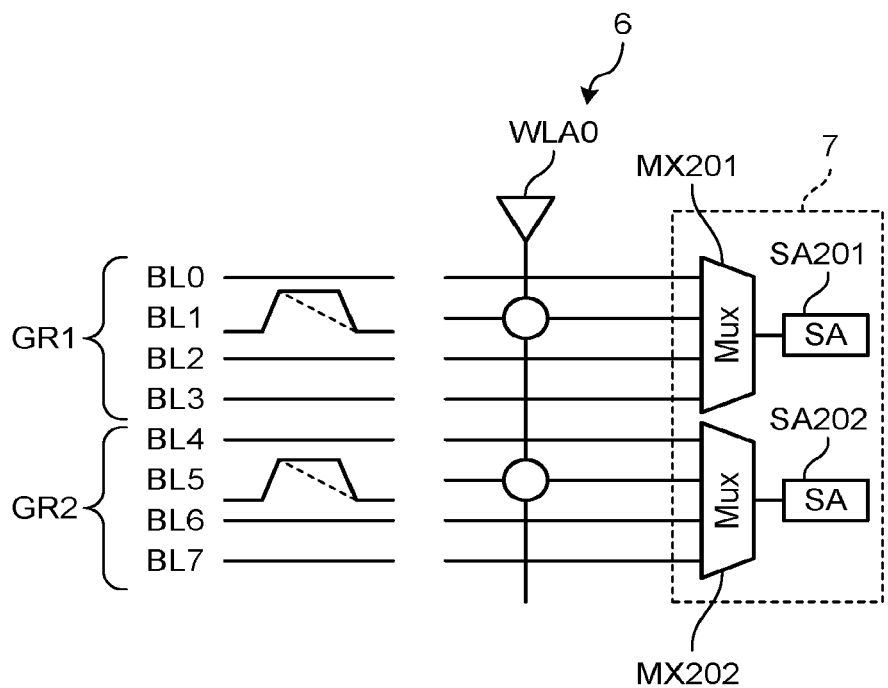

Note that although the first and second embodiments do not refer to the configuration in the sense amplifier 7, the sense amplifier 7 may be configured as illustrated in FIGS. 12A to 12C, for example. FIGS. 12A to 12C are circuit diagrams illustrating the configuration of a sense amplifier according to a modification of the second embodiment. While FIGS. 12A to 12C illustrate the case where the number of bit lines BL is eight, the number of bit lines BL may be two to seven or nine or more.

As mentioned above, the sense amplifier 7 may be configured to select all of the bit lines BL0 to BL7 as illustrated in FIG. 12A, because the voltage of the selected potential may be applied to the bit line BL to be written or read. Alternatively, as illustrated in FIG. 12B, the sense amplifier 7 may be configured such that one bit line BL is selected. Alternatively, as illustrated in FIG. 12C, the sense amplifier 7 may be configured such that a plurality of bit lines BL selected for each group is selected from a plurality of grouped bit lines BL.

The sense amplifier 7 illustrated in FIG. 12A has a plurality of sense amplifier modules SA0 to SA7 corresponding to a plurality of bit lines BL0 to BL7. Each of the sense amplifier modules SA0 to SA7 is connected to a corresponding bit line BL.

For example, when the low level $V_{L3}$ (see FIG. 11) as the selected potential is supplied from the driver WLA0 to the word line WLA0 in a local decoder 6, the sense amplifier 7 sets the bit lines BL0 to BL7 to the high level $V_{H4}$ as the select potential. Thus, as illustrated by a circle in FIG. 12A, each memory cell MC at a position where the word line WLA0 and the plurality of bit lines BL0 to BL7 intersect is selected, and the cell currents flowing through the plurality of bit lines BL0 to BL7 are detected in parallel by the plurality of sense amplifier modules SA0 to SA7. Thus, the sense amplifier 7 can perform a sense amplifier operation at high speed.

Alternatively, the sense amplifier 7 illustrated in FIG. 12B has a multiplexer MX100 and a sense amplifier module SA100. The multiplexer MX100 is connected between the plurality of bit lines BL0 to BL7 and the sense amplifier module SA100. The sense amplifier module SA100 is shared by the plurality of bit lines BL0 to BL7 via the multiplexer MX100. Thus, when the memory cell array 5 is subdivided into a plurality of sub-arrays AR (1, 1) to AR (m, n) as illustrated in FIG. 8, the circuit area of the sense amplifier 7 can be reduced.

For example, as illustrated in FIG. 12B, when the low level $V_{L3}$ (see FIG. 11) as the selected potential is supplied from the driver WLA0 to the word line WLA0 in the local decoder 6, the sense amplifier 7 sets one bit line BL1 to high level $V^{H4}$ as the selected potential and sets the other bit lines BL0, and BL2 to BL7 to the low level VIA as the unselected potential. In response, the sense amplifier 7 controls the multiplexer MX100 to select the bit line BL1 supplied with the selected potential and connect the bit line to the sense amplifier module SA100. Thus, as illustrated by a circle in FIG. 12B, each memory cell MC at a position where the word line WLA0 intersects the selected bit line BL1 is selected, and each memory cell MC at a position where the word line WLA0 intersects the unselected bit lines BL0 and BL2 to BL7 is unselected. The cell current flowing in the selected bit line BL1 is detected by the sense amplifier module SA100 via the multiplexer MX100.

Alternatively, the sense amplifier 7 illustrated in FIG. 12C has a plurality of multiplexers MX201 and MX202 and a plurality of sense amplifier modules SA201 and SA202. The multiplexer MX201 is connected between the plurality of bit lines BL0 to BL3 and the sense amplifier module SA201. The multiplexer MX202 is connected between the plurality of bit lines BL4 to BL7 and the sense amplifier module SA202. In other words, the plurality of bit lines BL0 to BL3 can be regarded as being grouped in the group GR1 corresponding to the sense amplifier module SA201, and the plurality of bit lines BL4 to BL7 can be regarded as being grouped in the group GR2 corresponding to the sense amplifier module SA202.

The sense amplifier module SA201 is shared by the plurality of bit lines BL0 to BL3 via the multiplexer MX201. The sense amplifier module SA202 is shared by the plurality of bit lines BL4 to BL7 via the multiplexer MX202. Thus, when the memory cell array 5 is subdivided into a plurality of sub-arrays AR (1, 1) to AR (m, n) as illustrated in FIG. 8, the circuit area of the sense amplifier 7 can be reduced.

For example, as illustrated in FIG. 12C, when the low level $V_{L3}$ (see FIG. 11) as the selected potential is supplied from the driver WLA0 to the word line WLA0 in the local decoder 6, the sense amplifier 7 sets one bit line BL1 to the high level $V_{H4}$ as the selected potential and sets the other bit lines BL0 and BL2 to BL3 to the low level $V_{L4}$ as the unselected potential in the group GR1. In response, the sense amplifier 7 controls the multiplexer MX201 to select the bit line BL1 supplied with the select potential and connect the bit line to the sense amplifier module SA201. Similarly, the sense amplifier 7 sets one bit line BL5 to the high level $V_{H4}$ as the selected potential and sets the other bit lines BL4 and BL6 to BL7 to the low level $V_{L4}$ as the unselected potential in the group GR2. In response, the sense amplifier 7 controls the multiplexer MX202 to select the bit line BL5 supplied with the selected potential and connect the bit line to the sense amplifier module SA202.

Thus, as illustrated by a circle in FIG. 12C, for the group GR1, each memory cell MC at a position where the word line WLA0 intersects the selected bit line BL1 is selected, and each memory cell MC at a position where the word line WLA0 intersects the unselected bit lines BL0 and BL2 to BL3 is unselected. The cell current flowing in the selected bit line BL1 is detected by the sense amplifier module SA201 via the multiplexer MX201. Similarly, for the group GR2, each memory cell MC at a position where the word line WLA0 intersects the selected bit line BL5 is selected, and each memory cell MC at a position where the word line WLA0 intersects the unselected bit lines BL4 and BL6 to BL7 is unselected. The cell current flowing in the selected bit line BL5 is detected by the sense amplifier module SA202 via the multiplexer MX202.

Third Embodiment

A nonvolatile semiconductor memory device 1 according to a third embodiment will then be described. In the following, the description will be focused on parts different from the first embodiment and the second embodiment.

While the first embodiment refers to a signal used in common with a word line of the same layer (or the same height) of adjacent string blocks SB and a signal used in common with a corresponding local string selection line within the same layer (or the same height) of adjacent string blocks SB, the third embodiment illustrates a connection configuration for the signals.

In the nonvolatile semiconductor memory device 1, each local string selection line SGA, SGB, SGC, and SGD in each local string LST in each adjacent string block SB in the bit line BL direction is used as a common signal with a corresponding local string selection line in the same layer (or the same height) of the adjacent string block SB. Thus, a circuit for driving the local string selection lines of a plurality of adjacent string blocks used as a common signal at the cell array end can be used in common.

For example, as illustrated in FIG. 13, the row decoder 6 has a plurality of drivers SGA0 to SGA15. FIG. 13 is a diagram illustrating a connection configuration of a local string selection line and a driver. The plurality of drivers SGA0 to SGA15 corresponds to a plurality of local string selection lines SGA0 to SGA15 in the string block SB0 and a plurality of local string selection lines SGA0 to SGA15 in the string block SB1. Each of the drivers SGA0 to SGA15 is connected to a corresponding local string selection line SGA in the string block SB0 and a corresponding local string selection line SGA in the string block SB1. In other words, the driver SGA in the row decoder 6 is used in common by the local string selection line SGA in the string block SB0 and the local string selection line SGA in the string block SB1. Thus, the number of drivers can be reduced as compared with the number of local string selection lines to be driven, so that the circuit area of the row decoder 6 can be reduced.

The driver SGA0 is connected to the local string selection line SGA0 in the string block SB0 and the local string selection line SGA0 in the string block SB1. In other words, the driver SGA0 in the row decoder 6 is used in common by the local string selection line SGA0 in the string block SB0 and the local string selection line SGA0 in the string block SB1.

The driver SGA1 is connected to the local string selection line SGA1 in the string block SB0 and the local string selection line SGA1 in the string block SB1. In other words, the driver SGA1 in the row decoder 6 is used in common by the local string selection line SGA1 in the string block SB0 and the local string selection line SGA1 in the string block SB1.

The driver SGA15 is connected to the local string selection line SGA15 in the string block SB0 and the local string selection line SGA15 in the string block SB1. In other words, the driver SGA15 in the row decoder 6 is used in common by the local string selection line SGA15 in the string block SB0 and the local string selection line SGA15 in the string block SB1.

In the nonvolatile semiconductor memory device 1, the plurality of stacked word lines WLA, WLB, WLC, and LWD in each adjacent string block SB in the bit line BL direction is used as a common signal with the word lines of the same layer (or the same height) of the adjacent string blocks SB. Thus, a circuit for driving the word lines of a plurality of adjacent string blocks used as a common signal at the cell array end can be used in common.

For example, as illustrated in FIG. 14, the row decoder 6 has a driver WLA0. The driver WLA0 corresponds to the word line WLA0 in the string block SB0, and corresponds to the word line WLA0 in the string block SB1. The driver WLA0 is connected to the corresponding word line WLA0 in the string block SB0 and the corresponding word line WLA0 in the string block SB1. In other words, the driver WLA0 in the row decoder 6 is used in common by the word line WLA0 in the string block SB0 and the word line WLA0 in the string block SB1. Thus, the number of drivers can be reduced as compared with the number of word lines to be driven, so that the circuit area of the row decoder 6 can be reduced.

In the nonvolatile semiconductor memory device 1, a block selection line STB of each adjacent string block SB is used as an independent signal. Thus, even when the signal of the local string selection line is used as a common signal between the adjacent string blocks SB and the signal of the word line is used as a common signal between the adjacent string blocks SB, the adjacent string blocks SB can be selected independently of each other.

Figure 15:
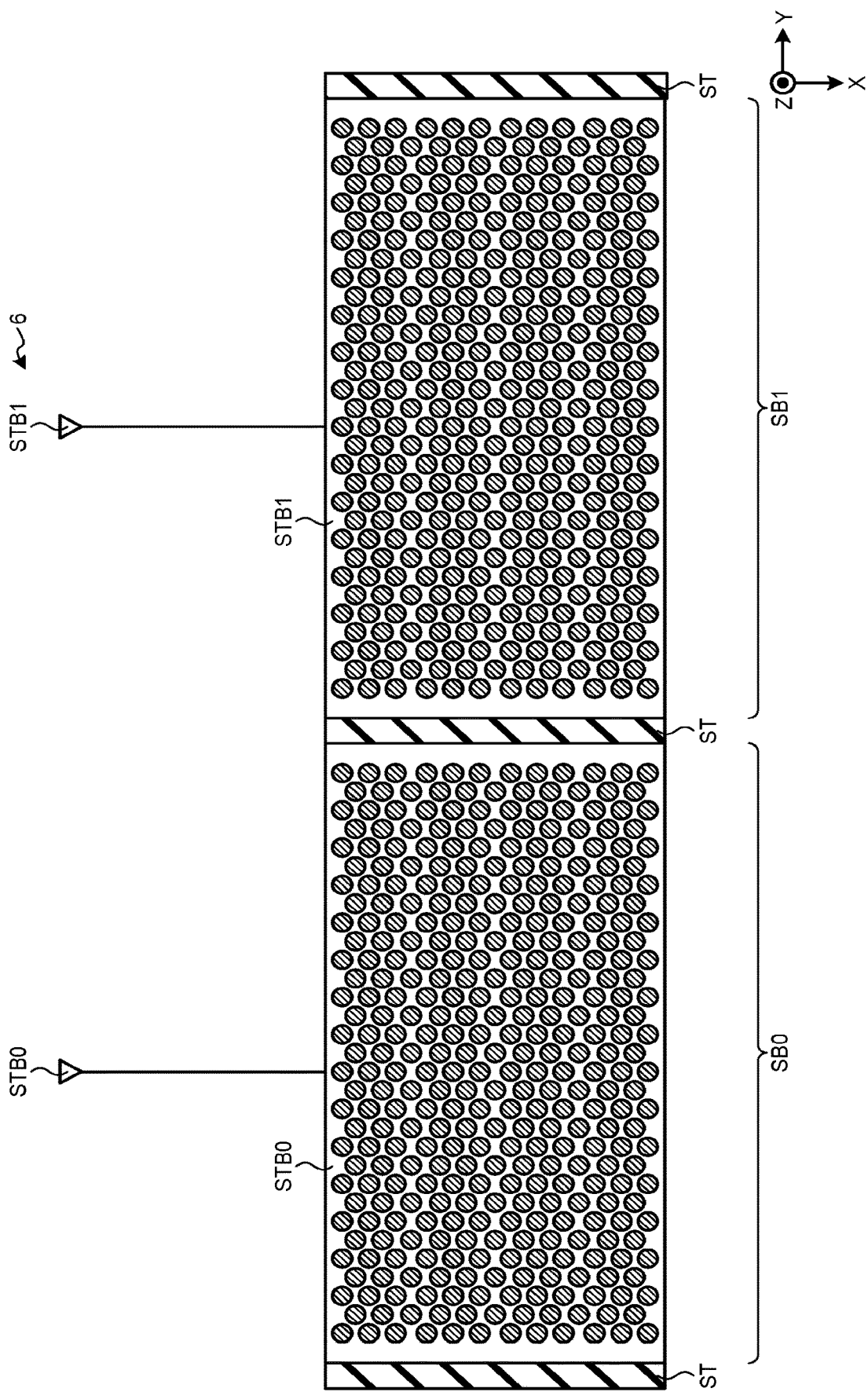
FIG. 15 is a diagram illustrating a connection configuration of a block selection line and a driver in the third embodiment.

For example, as illustrated in FIG. 15, the row decoder 6 has a plurality of drivers STB0 and STB1. The driver STB0 corresponds to the block selection line STB0 in the string block SB0, and the driver STB1 corresponds to the block selection line STB1 in the string block SB1. The driver STB0 is connected to the block selection line STB0 in the string block SB0, and the driver STB1 is connected to the block selection line STB1 in the string block SB1. In other words, the block selection line STB0 in the string block SB0 and the block selection line STB1 in the string block SB1 are independently connected to different drivers STB0 and STB1 in the row decoder 6. Thus, the row decoder 6 can drive the block selection line STB0 in the string block SB0 and the block selection line STB1 in the string block SB1 independently of each other.

As described above, in the third embodiment, the driver SGA in the row decoder 6 is used in common by the local string selection line SGA in the string block SB0 and the local string selection line SGA in the string block SB1. Thus, the number of drivers can be reduced as compared with the number of local string selection lines to be driven, so that the circuit area of the row decoder 6 can be reduced.

In the third embodiment, the driver WLA0 in the row decoder 6 is used in common by the word line WLA0 in the string block SB0 and the word line WLA0 in the string block SB1. Thus, the number of drivers can be reduced as compared with the number of word lines to be driven, so that the circuit area of the row decoder 6 can be reduced.

In the third embodiment, the word line WLA0 in the string block SB0 and the word line WLA0 in the string block SB1 are independently connected to different drivers STB0 and STB1 in the row decoder 6. Thus, the row decoder 6 can drive the word line WLA0 in the string block SB0 and the word line WLA0 in the string block SB1 independently of each other.

Fourth Embodiment

A nonvolatile semiconductor memory device 1 according to a fourth embodiment will then be described. In the following, the description will be focused on parts different from the first to third embodiments.

While the first embodiment does not refer to the planar configuration of the string block SB, the fourth embodiment illustrates the planar configuration of the string block SB.

Specifically, as illustrated in FIGS. 16A to 16F, each string block SB can be configured in any planar configuration. FIGS. 16A to 16F are plan views and cross sectional views illustrating the configuration of the string block.

For example, in each string block SB, the X-direction columns of the local string LSTA intersecting each local string selection line SGA may be four columns as illustrated in FIG. 16A, two columns as illustrated in FIG. 16B, or one column as illustrated in FIG. 16C.

The XY plan view illustrated in FIG. 16A illustrates a four-column cell configuration, in which pillars of the local string LSTA are arranged in four columns in one local string selection line SGA with four pillars shifted in the bit line BL direction. Each bit line BL is connected to any of four local strings LSTA intersecting on the XY plan view in one local string selection line SGA through a contact electrode. FIG. 16D illustrates an enlarged XZ cross section of the C-C line in FIG. 16A with respect to the bit line BL. As illustrated in FIG. 16D, in the four-column cell configuration, bit lines BL are arranged in the X direction at a pitch P1. In response, each bit line BL has a cross-sectional area S1.

The XY plan view illustrated in FIG. 16B illustrates a two-column cell configuration, in which pillars of the local string LSTA are arranged in two columns in one local string selection line SGA with two pillars shifted in the bit line BL direction. Each bit line BL is connected via a contact electrode to a local string LSTA which intersects on an XY plan view among two columns in one local string selection line SGA. FIG. 16E illustrates an enlarged XZ cross section of the D-D line in FIG. 16B with respect to the bit line BL. As illustrated in FIG. 16E, in the two-column cell configuration, the bit lines BL are arranged in the X direction at a looser pitch P2 (>P1). In response, each bit line BL has a larger cross-sectional area S2 (>S1).

The XY plan view illustrated in FIG. 16C illustrates a one-column cell configuration, in which pillars of the local string LSTA are arranged in one column in the bit line BL direction in one local string selection line SGA. Each bit line BL is connected via a contact electrode to a local string LSTA intersecting on an XY plan view in one local string selection line SGA. FIG. 16F illustrates an enlarged XZ cross section of the E-E line in FIG. 16C with respect to the bit line BL. As illustrated in FIG. 16F, in the one-column cell configuration, the bit lines BL are arranged in the X direction at a looser pitch P3 (>P2). In response, each bit line BL has a larger cross-sectional area S3 (>S2).

As described above, in the fourth embodiment, the resistance of the bit line BL can be changed according to the planar configuration of each string block SB. For example, bit line BL resistance can be reduced by reducing the number of columns of local strings LST arranged in one local string selection line SG. In other words, the voltage drop of the bit line BL drive can be adjusted according to the required cell current.

Fifth Embodiment

A nonvolatile semiconductor memory device 1 according to a fifth embodiment will then be described. In the following, the description will be focused on parts different from the first to fourth embodiments.

While the second embodiment illustrates a basic operation of the nonvolatile semiconductor memory device 1, the fourth embodiment illustrates an operation for further reducing power consumption.

Figure 17A:
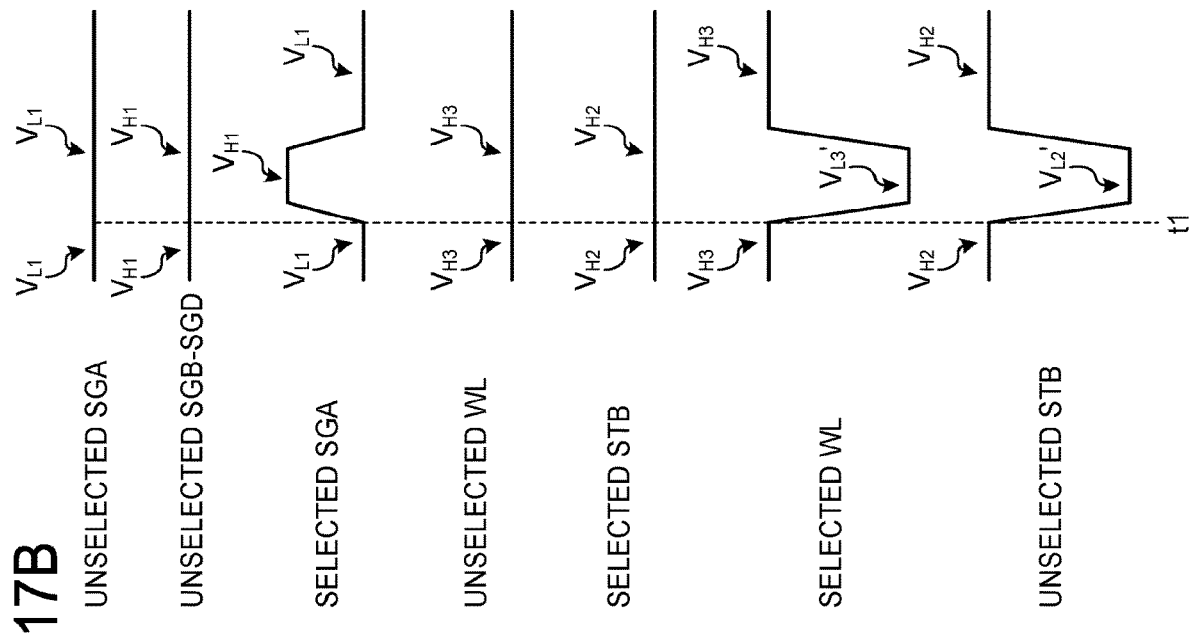
FIGS. 17A and 17B are waveform diagrams illustrating an operation of a nonvolatile semiconductor memory device according to a fifth embodiment.
Figure 17B:
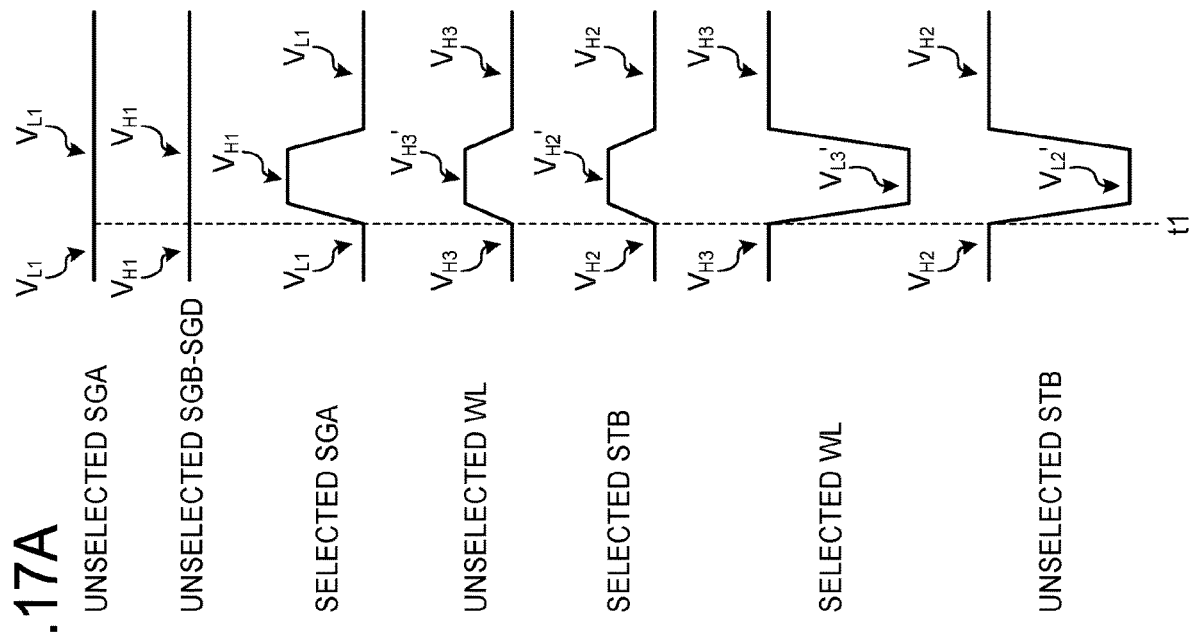

Specifically, the nonvolatile semiconductor memory device 1 can operate as illustrated in FIGS. 17A and 17B. FIGS. 17A and 17B illustrate an example of an operation of the string block.

For example, the write (reset/set) operation is illustrated in FIG. 17A, and the read operation is illustrated in FIG. 17B.

When a word line signal and a local string selection line signal are shared by the plurality of string blocks of the present embodiment, current consumption may increase due to an increase in parasitic capacitance of each signal. The reason of the above case is that, when the memory cell MC is selected (e.g., timing t1 of FIG. 11), all unselected local string selection lines SGB to SGD other than the uppermost one are transited from the intermediate potential $V_{M1}$ to the high level $V_{H3}$, all unselected word lines WL are transited from the low level $V_{L3}$ to the high level $V_{H3}$, and the selected block selection lines are transited from the low level $V_{L2}$ to the high level $V_{H2}$, so that a large potential difference is generated transiently and a large current easily flows. This tendency can be serious when the number of stacked word lines is large. In such a case, this tendency becomes a problem because the speed at the time of reading is fast.

As a countermeasure for this problem, as illustrated in FIG. 17B, the potentials of the unselected local string selection lines SGB to SGD, the unselected word line WL, and the selected block selection line STB during standby (e.g., immediately before the timing t1 illustrated in FIG. 17B) are set to the high potentials $V_{H1}$, $V_{H3}$, and $V_{H2}$ in advance, respectively, and are set to substantially the same as the unselected potential (high level $V_{H1}$), the unselected potential (high level $V_{H3}$), and the selected potential (high level $V_{H2}$) at the time of reading. Thus, it is not necessary to drive the potential of the unselected word line potential WL and the potential of the selected block selection line STB at the time of reading (e.g., timing t1). Thus, the current consumption at the time of reading can be substantially zero. The selected word line WL is transited from the high level $V_{H3}$ to the low level $V_{L3}'$ at the time of reading. The unselected block selection line STB is transited from the high level $V_{H2}$ to the low level $V_{L2}'$ at the time of reading. The low level $V_{L3}'$ may be lower than the low level $V_{L3}$ (see FIG. 11). The low level $V_{L2}'$ may be lower than the low level $V_{L2}$. However, during standby, it is preferable that the uppermost unselected local string selection line SG be set to the low level $V_{L1}$ (see FIG. 11) so that no current flows from the bit line BL.

As illustrated in FIG. 17A, the write standby is the same as the read standby, but the time of writing (timing t1 illustrated in FIG. 17A) is different from the time of reading in that the unselected word line WL and the selected block selection line STB are set to the potentials $V_{H3}'$ and $V_{H2}'$ higher than the reading. The difference between the high potentials $V_{H3}'$ and $V_{H2}'$ and the high levels $V_{H3}$ and $V_{H2}$ is smaller than the difference between the high levels $V_{H3}$ and $V_{H2}$ and the low levels $V_{L3}'$ and $V_{L2}'$, and the current consumption can be easily suppressed.

Note that when the dependence of the read/write current consumption on the number of stacked word lines has been examined, it has been confirmed that the read current consumption has hardly increased even if the number of stacked word lines has been increased and the number of unselected word lines has been increased. It is conceivable that as the number of string blocks is increased, the parasitic capacitance of the signal to be operated is increased, so that the current consumption is increased but slightly increased.

As described above, in the fifth embodiment, in the nonvolatile semiconductor memory device 1, the unselected local string selection lines SGB to SGD, the unselected word line WL, and the selected block selection line STB are set to a high level during read/write standby. Thus, the driving power of the unselected local string selection lines SGB to SGD, the unselected word line WL, and the selected block selection line STB at the time of reading and writing can be reduced, and the power consumption of the nonvolatile semiconductor memory device 1 can be reduced.

Sixth Embodiment

A nonvolatile semiconductor memory device according to a sixth embodiment will then be described. In the following, the description will be focused on parts different from the first to fifth embodiments.

While the first embodiment illustrates a configuration in which the block selection line STB is disposed in the lowermost local string block LSBD of each string block SB, the sixth embodiment illustrates a configuration in which the block selection line STB is disposed in the uppermost local string block LSBA of each string block SB.

Figure 18:
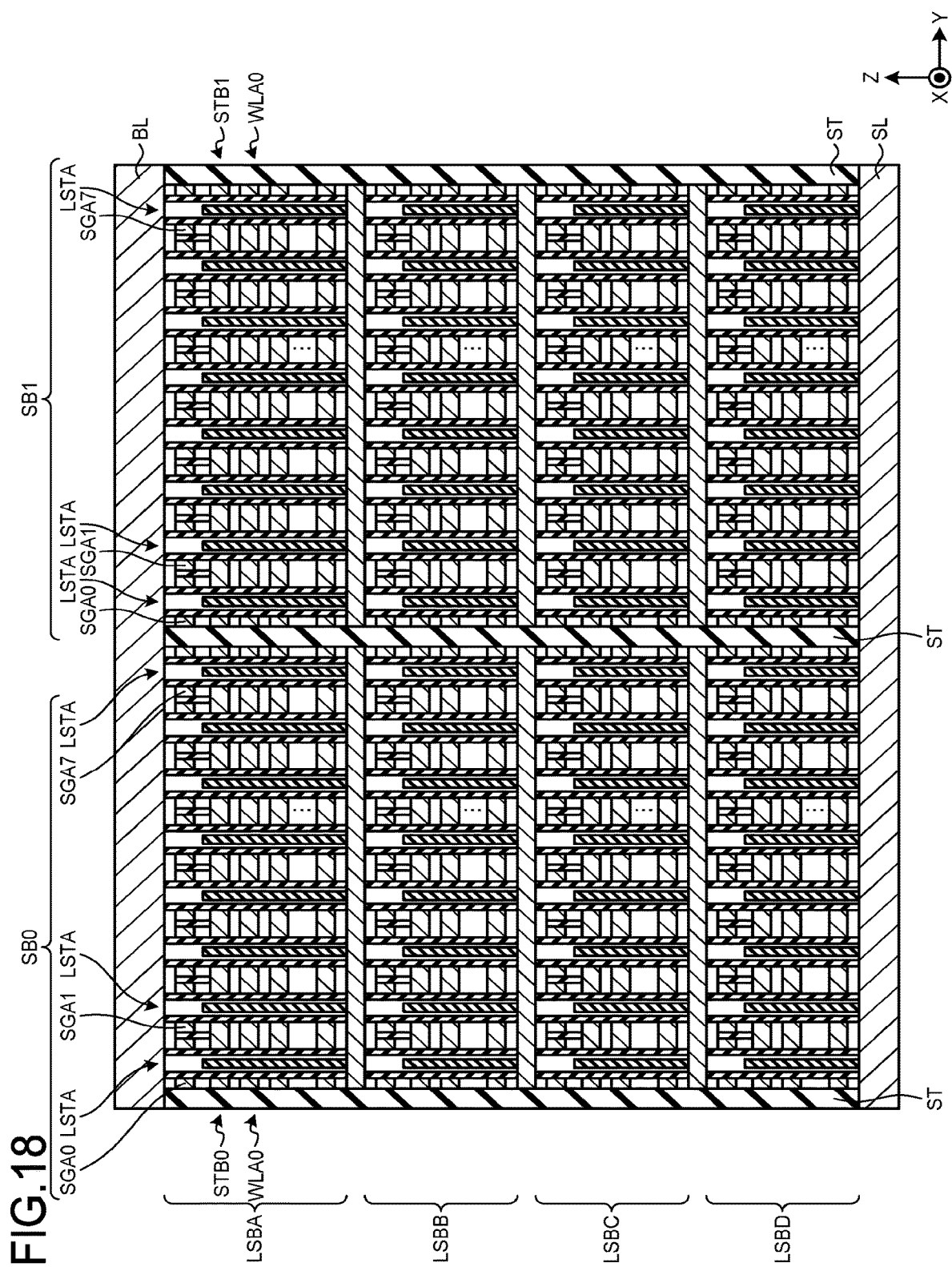
FIG. 18 is a cross-sectional view illustrating a configuration of a nonvolatile semiconductor memory device according to a sixth embodiment.

Specifically, as illustrated in FIG. 18, in the string block SB0, the block selection line STB0 is disposed at a height between the uppermost word line WLA0 and the string block selection lines SGA0 to SGA7, in the uppermost local string block LSBA. In the block selection line STB0, the block selection transistors STB0 are each configured at a position crossing a plurality of (in FIG. 18, eight) local strings LSTA arranged in the Y direction in the local string block LSBA. The block selection line STB0 is commonly connected to the block selection transistors STB0 of the plurality of local strings LSTD arranged in the Y direction.

Similarly, in the string block SB1, the block selection line STB1 is disposed at a height between the uppermost word line WLA0 and the string block selection lines SGA0 to SGA7, in the uppermost local string block LSBA. In the block selection line STB1, the block selection transistors STB1 are each configured at a position crossing a plurality of (in FIG. 18, eight) local strings LSTA arranged in the Y direction in the local string block LSBA. The block selection line STB1 is commonly connected to the block selection transistors STB1 of the plurality of local strings LSTD arranged in the Y direction.

Note that the signal of the block selection line STB0 and the signal of the block selection line STB1 are independent of each other, as in the first embodiment. Thus, the row decoder 6 can independently select the string block SB0 and the string block SB1.

As described above, in the sixth embodiment, in the nonvolatile semiconductor memory device 1, the block selection line STB is disposed in the uppermost local string block LSBA of each string block SB. In such a case, for the adjacent string blocks SB0 and SB1 in the bit line direction, the signal of the block selection line STB0 and the signal of the block selection line STB1 are independent of each other. Therefore, such a configuration also allows the row decoder 6 to independently select the string block SB0 and the string block SB1.

Seventh Embodiment

A nonvolatile semiconductor memory device according to a sixth embodiment will then be described. In the following, the description will be focused on parts different from the first to sixth embodiments.

While the sixth embodiment illustrates a configuration in which the block selection line STB is disposed in the uppermost local string block LSBA of each string block SB, the seventh embodiment illustrates another configuration in which the block selection line STB is disposed in the uppermost local string block LSBA of each string block SB.

Figure 19:
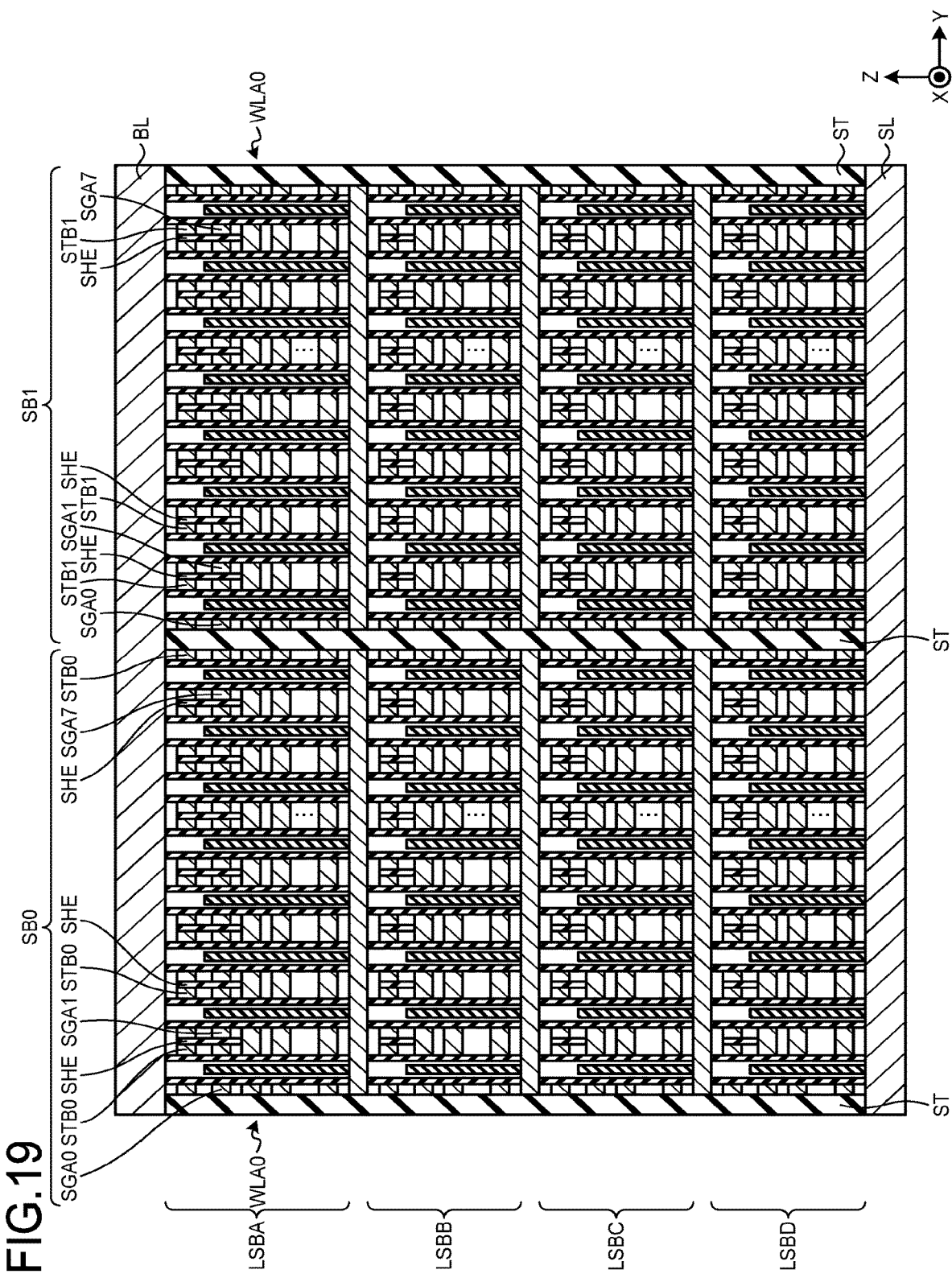
FIG. 19 is a cross-sectional view illustrating a configuration of a nonvolatile semiconductor memory device according to a seventh embodiment.

Specifically, as illustrated in FIG. 19, in the string block SB0, a plurality of block selection lines STB0 is disposed at a height between the string block selection lines SGA0 to SGA7 and the bit line BL, in the uppermost local string block LSBA. The plurality of block selection lines STB0 is electrically isolated from each other through the partition film SHE. The plurality of block selection lines STB0 is supplied with a common signal. In the plurality of block selection lines STB0, the block selection transistors STB0 are each configured at a position crossing a plurality of (in FIG. 19, eight) local strings LSTA arranged in the Y direction in the local string block LSBA, as in the sixth embodiment.

Similarly, in the string block SB1, a plurality of block selection lines STB1 is disposed at a height between the string block selection lines SGA0 to SGA7 and the bit line BL, in the uppermost local string block LSBA. The plurality of block selection lines STB1 is electrically isolated from each other through the partition film SHE. The plurality of block selection lines STB1 is supplied with a common signal. In the plurality of block selection lines STB1, the block selection transistors STB0 are each configured at a position crossing a plurality of (in FIG. 19, eight) local strings LSTA arranged in the Y direction in the local string block LSBA, as in the sixth embodiment.

Note that the signal of the block selection line STB0 and the signal of the block selection line STB1 are independent of each other, as in the first embodiment. Thus, the row decoder 6 can independently select the string block SB0 and the string block SB1.

As described above, in the seventh embodiment, in the nonvolatile semiconductor memory device 1, the block selection line STB is disposed in the uppermost local string block LSBA of each string block SB. For example, in the uppermost local string block LSBA, a plurality of block selection lines STB is disposed at a height between the string block selection lines SGA0 to SGA7 and the bit line BL. In such a case, for the adjacent string blocks SB0 and SB1 in the bit line direction, the signal of the block selection line STB0 and the signal of the block selection line STB1 are independent of each other. Therefore, such a configuration also allows the row decoder 6 to independently select the string block SB0 and the string block SB1.

Note that when the configuration illustrated in FIG. 19 is adopted, the connection between the plurality of block selection lines and the row decoder 6 may be configured as illustrated in FIG. 20. The row decoder 6 has a plurality of drivers STB0 and STB1. The driver STB0 corresponds to the plurality of block selection lines STB0 in the string block SB0, and the driver STB1 corresponds to the plurality of block selection lines STB1 in the string block SB1. The driver STB0 is commonly connected to the plurality of block selection lines STB0 in the string block SB0, and the driver STB1 is commonly connected to the plurality of block selection lines STB1 in the string block SB1. Thus, the number of drivers can be reduced for each string block.

In other words, the plurality of block selection lines STB0 in the string block SB0 and the plurality of block selection lines STB1 in the string block SB1 are independently connected to different drivers STB0 and STB1 in the row decoder 6. Thus, the row decoder 6 can drive the plurality of block selection lines STB0 in the string block SB0 and the plurality of block selection lines STB1 in the string block SB1 independently of each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a bit line extending in a first direction;
   a source line; and
   a cell array including a plurality of string blocks, each of the string blocks being connected to the bit line at one end and connected to the source line at the other end, the string blocks being arranged with each other in the first direction, wherein
   the string block has a plurality of local string blocks, the local string blocks being connected in series between the bit line and the source line by means of one or more local bit lines, one end of an upper most one of the local string blocks being connected to the bit line, the other one end of a lower most one of the local string blocks being connected to the source line,
   the local string block has a plurality of local strings, the local strings being connected in parallel between the bit line and a uppermost one of the local bit lines, between two adjacent local bit lines, or between a lowermost one of the local bit lines and the source line,
   the local string has a plurality of memory cells and a string selection transistor, the memory cells each including a cell transistor and a resistance change element, a gate terminal of the cell transistor being connected to a word line, the resistance change element being connected in parallel to both ends of the cell transistor, the memory cells being connected in series, a gate terminal of the string selection transistor being connected to a string selection line, the string selection transistors being further connected in series to the memory cells,
   among the local string blocks, one local string block includes a block selection transistor and remaining local string blocks do not include a block selection transistor, a gate terminal of the block selection transistor of the one local string block being connected to a block selection line,
   signals of two word lines connected to two adjacent string blocks in the first direction are common signals, and
   signals of two block selection lines connected to the two adjacent string blocks are independent of each other.

2. The nonvolatile semiconductor memory device according to claim 1, wherein signals of a plurality of the string selection lines connected to an identical local string block are independent of each other, and signals of the two string selection lines connected to two adjacent local string blocks in the first direction are common signals.

3. The nonvolatile semiconductor memory device according to claim 1, wherein signals of a plurality of word lines connected to one local string block correspond to signals of a plurality of word lines connected to another local string block adjacent to the one local string block, and a signal of each of a plurality of word lines connected to the one local string block is a signal common to a signal of a corresponding word line of a plurality of word lines connected to the other local string block.

4. The nonvolatile semiconductor memory device according to claim 2, wherein signals of a plurality of string selection lines connected to one local string block correspond to signals of a plurality of string selection lines connected to another local string block adjacent to the one local string block, and a signal of each of a plurality of string selection lines connected to the one local string block is a signal common to a signal of a corresponding string selection line of a plurality of string selection lines connected to the other local string block.

5. The nonvolatile semiconductor memory device according to claim 1, wherein signals of a plurality of block selection lines connected to one local string block are common signals, signals of a plurality of block selection lines connected to another local string block adjacent to the one local string block are common signals, and a signal of each of a plurality of block selection lines connected to the one local string block is a signal independent of a signal of each of a plurality of block selection lines connected to the other local string block.

6. The nonvolatile semiconductor memory device according to claim 1, wherein the two word lines are connected to an identical wire at a cell array end and driven by an identical driving circuit.

7. The nonvolatile semiconductor memory device according to claim 1, wherein the two block selection lines are connected to a different wire at a cell array end and driven by a different driving circuit.

8. The nonvolatile semiconductor memory device according to claim 2, wherein the two string selection lines are connected to an identical wire at a cell array end and driven by an identical driving circuit.

9. The nonvolatile semiconductor memory device according to claim 5, wherein a plurality of block selection lines connected to the one local string block is connected to an identical wire at a cell array end and driven by an identical driving circuit, a plurality of block selection lines connected to the other local string block is connected to an identical wire at a cell array end and driven by an identical driving circuit, and each of a plurality of block selection lines connected to the one local string block is connected to a different wire from each of a plurality of block selection lines connected to the other local string block at a cell array end and is driven by a different driving circuit.

10. The nonvolatile semiconductor memory device according to claim 1, wherein the one local string block including the block selection transistor is a local string block on the source line side of the local string blocks.

11. The nonvolatile semiconductor memory device according to claim 1, wherein the one local string block including the block selection transistor is a local string block on the bit line side of the local string blocks.

12. The nonvolatile semiconductor memory device according to claim 10, wherein the block selection transistor is connected between the word line and the source line in a local string block on the source line side.

13. The nonvolatile semiconductor memory device according to claim 11, wherein the block selection transistor is connected between the word line and the bit line in a local string block on the bit line side.

14. The nonvolatile semiconductor memory device according to claim 13, wherein the block selection transistor is connected between the string selection transistor and the bit line in a local string block on the bit line side.

15. The nonvolatile semiconductor memory device according to claim 13, wherein the block selection transistor is connected between the word line and the string selection transistor in a local string block on the bit line side.

16. The nonvolatile semiconductor memory device according to claim 1, wherein both ends of the string selection transistor are connected in parallel to the resistance change element.

17. The nonvolatile semiconductor memory device according to claim 1, wherein the resistance change element is composed of a first film having a cylindrical shape, and a channel region of the cell transistor is composed of a second film having a cylindrical shape disposed outside the first film.

18. The nonvolatile semiconductor memory device according to claim 1, wherein the resistance change element is formed of a material mainly composed of at least one of Ge, Sb, and Te.

19. The nonvolatile semiconductor memory device according to claim 1, wherein when data is written to a selected memory cell, an unselected word line connected to a selected string block is set to a second potential higher than a first potential during standby, and when data is read from a selected memory cell, an unselected word line connected to a selected string block is maintained at the second potential.

20. The nonvolatile semiconductor memory device according to claim 1, wherein the cell array is divided into a plurality of sub-arrays, and a driving circuit of the cell array is divided and disposed at an end of each of the sub-arrays.

* * * * *